(12) United States Patent
Paulus

(10) Patent No.: US 7,142,835 B2
(45) Date of Patent: *Nov. 28, 2006

(54) APPARATUS AND METHOD FOR DIGITAL IMAGE CORRECTION IN A RECEIVER

(75) Inventor: Tod Paulus, New York, NY (US)

(73) Assignee: Silicon Laboratories, Inc., Austin, TX (US)

( * ) Notice: Subject to any disclaimer, the term of this patent is extended or adjusted under 35 U.S.C. 154(b) by 421 days.

This patent is subject to a terminal disclaimer.

(21) Appl. No.: 10/675,601

(22) Filed: Sep. 29, 2003

(65) Prior Publication Data

US 2005/0070239 A1    Mar. 31, 2005

(51) Int. Cl.
*H04B 17/02* (2006.01)

(52) U.S. Cl. ............... 455/302; 455/305; 375/350

(58) Field of Classification Search ......... 455/302, 455/298, 305; 375/346, 350
See application file for complete search history.

(56) References Cited

U.S. PATENT DOCUMENTS

| | | | |
|---|---|---|---|
| 5,826,180 | A | 10/1998 | Golan |
| 6,137,999 | A | 10/2000 | Lovelace et al. |
| 6,144,845 | A | 11/2000 | Durec |
| 6,330,290 | B1 | 12/2001 | Glas |
| 6,785,529 | B1 | 8/2004 | Ciccarelli et al. |
| 6,892,060 | B1 * | 5/2005 | Zheng .................. 455/302 |
| 2003/0072393 | A1 * | 4/2003 | Gu ....................... 375/322 |
| 2005/0009483 | A1 | 1/2005 | Eilts et al. |
| 2005/0070236 | A1 | 3/2005 | Paulus |
| 2006/0019624 | A1 | 1/2006 | Suominen |

OTHER PUBLICATIONS

Yu, Ll and W. Martin Snelgrove. "A Novel Adaptive Mismatch Cancellation System for Quadrature IF Radio Receivers". IEEE Transactions on Circuits and Systems-II: Analog and Digital Signal Processing, vol. 46, No. 6, Jun. 1999.*

"Circuit Design for Wireless Communications: Improved Techniques for Image Rejection in Wideband Quadrature Receivers"; Kong-Pang Pun, The Chinese Univesity of Hong Kong; Jose Epifanio da Franco, ChipIdea Microelectronics S.A., Portugal and Carlos Azeredo-Leme, Instituto Superior Tecnico, Lisbon, Portugal; The Kluwer International Series in Engineering and Computer Science 728; Apr. 2003; hardbond; 217pp. ISBN 1-4020-7415-8.

(Continued)

*Primary Examiner*—Lana Le
*Assistant Examiner*—Adeel Haroon
(74) *Attorney, Agent, or Firm*—Meyertons Hood Kivlin Kowert & Goetzel, P.C.; B. Noël Kivlin; Stephen J. Curran

(57) ABSTRACT

An apparatus and method for performing digital image correction in a receiver. In one embodiment, a receiver circuit may include an IQ signal source configured to provide a digital signal comprising in-phase (I) and quadrature (Q) components, such as an IQ mixer in combination with an analog to digital converter, for example. The receiver circuit may also include an image correction unit coupled to the IQ signal source and configured to combine the digital signal with a complex image correction factor. The image correction unit may be implemented using a digital signal processor under the control of associated program instructions, for example. In one specific implementation of the receiver circuit, the image correction unit may be configured to combine the digital signal with the complex image correction factor using a cross-accumulation operation.

21 Claims, 13 Drawing Sheets

OTHER PUBLICATIONS

"Analysis of Improved Hartley Image-Reject Receivre by Bandpass Delta-Sigma Modulator"; Tsung-Yuan Chang, Department of Electrical Engineering at the Ohio State University, and Steven B. Bibyk, Department of Electrical Engineering at the Ohio State Engineering; Analog Integrated Circuits and Signal Processing; © 1999 Kluwer Academic Publishers, Boston, Manufactured in The Netherlands.

"Adaptive Calibration Methods for an Image-Reject Mixer"; Isaac Sever; Research Project submitted to the Department of Electrical Engineering and Computer Sciences, University of California at Berkeley; pp. 1-57.

"Aero™ I/Aero I+GSM/GPRS Transceiver"; Product Description; Silicon Laboratories, Austin, TX;www.silabs.com.

"Self-Calibrated Image-Reject Mixer"; John Wetherell (Professor Robert Meyer), Qualcomm; http//www.eecs.berkeley.edu/~wetherel.

"On-Chip Image Reject Techniques for Wireless Receivers"; Nora Yan; University of Toronto Department of Electrical and Computer Engineering; Nov. 12, 2001.

* cited by examiner

Input to RF-LO IQ mixer

Output of RF-LO IQ mixer

Output of ADC with calibration tone input at LO mixer

Output of BPF

APPARATUS AND METHOD FOR DIGITAL IMAGE CORRECTION IN A RECEIVER

BACKGROUND OF THE INVENTION

1. Field of the Invention

This invention relates to radio frequency communication systems and, more particularly, to correction of received image frequency signals in receiver systems.

2. Description of the Related Art

In many modern communication systems, information is transmitted and received by modulating a radio frequency (RF) carrier signal with a data signal and then demodulating the RF signal to recover the data signal. Demodulating an RF carrier signal usually involves tuning a receiver to the carrier signal, which may be at a substantially higher frequency than the frequencies of the data it conveys. For example, a carrier signal frequency may be on the order of 1–2 GHz, whereas the bandwidth of the data channel conveyed by the carrier signal may be on the order of only 100–200 kHz.

In one approach to demodulating an RF signal, a bandpass filter having a bandwidth approximately equal to the data channel bandwidth may be tuned to the RF carrier signal frequency, and the filter output may be demodulated according to the original modulation scheme. However, narrow-bandwidth bandpass filters become increasingly difficult and bulky to implement as their center frequencies increase. Consequently, many RF receiver systems use some form of heterodyning to convert a received RF signal to a lower frequency (referred to as an intermediate frequency, or IF), where the task of filtering may be easier.

Generally speaking, heterodyning a signal involves mathematically multiplying one signal, such as an RF signal, with a second signal close in frequency to the first, often referred to as a local oscillator (LO). Such an operation, also referred to as mixing, results in signals at frequencies equal to the sum and difference of the RF frequency and the LO frequency. The sum frequency is usually substantially higher than the RF or LO frequency and may be readily filtered using a simple low-pass filter. The difference frequency is the IF frequency, which is usually close to DC and is therefore readily manipulated by simple filters.

Typical heterodyne systems are susceptible to a phenomenon referred to as imaging. As described above, a given desired RF frequency $f_{RF}$ differs from a given LO frequency $f_{LO}$ by the IF frequency $f_{IF}$. Further, a given desired RF frequency may lie either above or below the LO frequency. However, due to its symmetric properties, heterodyning will select any RF signal differing from $f_{LO}$ by $f_{IF}$, irrespective of whether the RF signal lies above or below the given LO frequency. For example, if a desired RF signal is at 1.01 GHz and the LO signal is at 1.00 GHz, mixing the two signals results in an IF of 10 MHz. However, if another RF signal is present at 990 MHz, this signal will also be translated to the 10 MHz IF, which may result in interference with the information content of the desired RF signal. In heterodyne systems generally, for a given RF signal of frequency $f_{RF}=f_{LO}\pm f_{IF}$, the frequency $f_{image}=f_{LO}\mp f_{IF}$ may be referred to as the image frequency.

To prevent interference with the desired RF signal, the image frequency may be filtered prior to heterodyne mixing. However, as noted above, such a filter may be difficult to implement, which is a primary motivation for implementing a heterodyne system. In some systems, quadrature receiver architectures may be employed that facilitate image frequency rejection by splitting the desired RF signal into two paths and mixing each path with a respective function of the LO signal, where the respective functions may have a particular phase relationship (such as sine and cosine functions). However, imbalances in gain and phase relationships between the two paths may yield imperfect image frequency rejection, resulting in undesired interference that may require further filtering or correction.

SUMMARY OF THE INVENTION

Various embodiments of an apparatus and method for performing digital image correction in a receiver are disclosed. In one embodiment, a receiver circuit may include an IQ signal source (as described below) configured to provide a digital signal comprising in-phase (I) and quadrature (Q) components, such as an IQ mixer in combination with an analog to digital converter, for example. The receiver circuit may also include an image correction unit coupled to the IQ signal source and configured to combine the digital signal with a complex image correction factor. The image correction unit may be implemented using a digital signal processor under the control of associated program instructions, for example.

In one specific implementation of the receiver circuit, the image correction unit may be configured to combine the digital signal with the complex image correction factor using a cross-accumulation operation. In another specific implementation of the receiver circuit, the cross-accumulation operation may include multiplying the in-phase component by a value of a first function of a real portion of the complex image correction factor to form a first product; multiplying the in-phase component by a value of a first function of an imaginary portion of the complex image correction factor to form a second product; multiplying the quadrature component by a value of a second function of the real portion of the complex image correction factor to form a third product; multiplying the quadrature component by a value of a second function of the imaginary portion of the complex image correction factor to form a fourth product; accumulating the first and fourth products; and accumulating the second and third products.

A method is further contemplated that may include generating a digital signal comprising in-phase (I) and quadrature (Q) components and responsively combining the digital signal with a complex image correction factor. In one specific implementation of the method, combining the digital signal with the complex image correction factor may include performing a cross-accumulation operation. In another specific implementation of the method, the cross-accumulation operation may include generating and accumulating four multiplicative products as described above.

Figure 1:
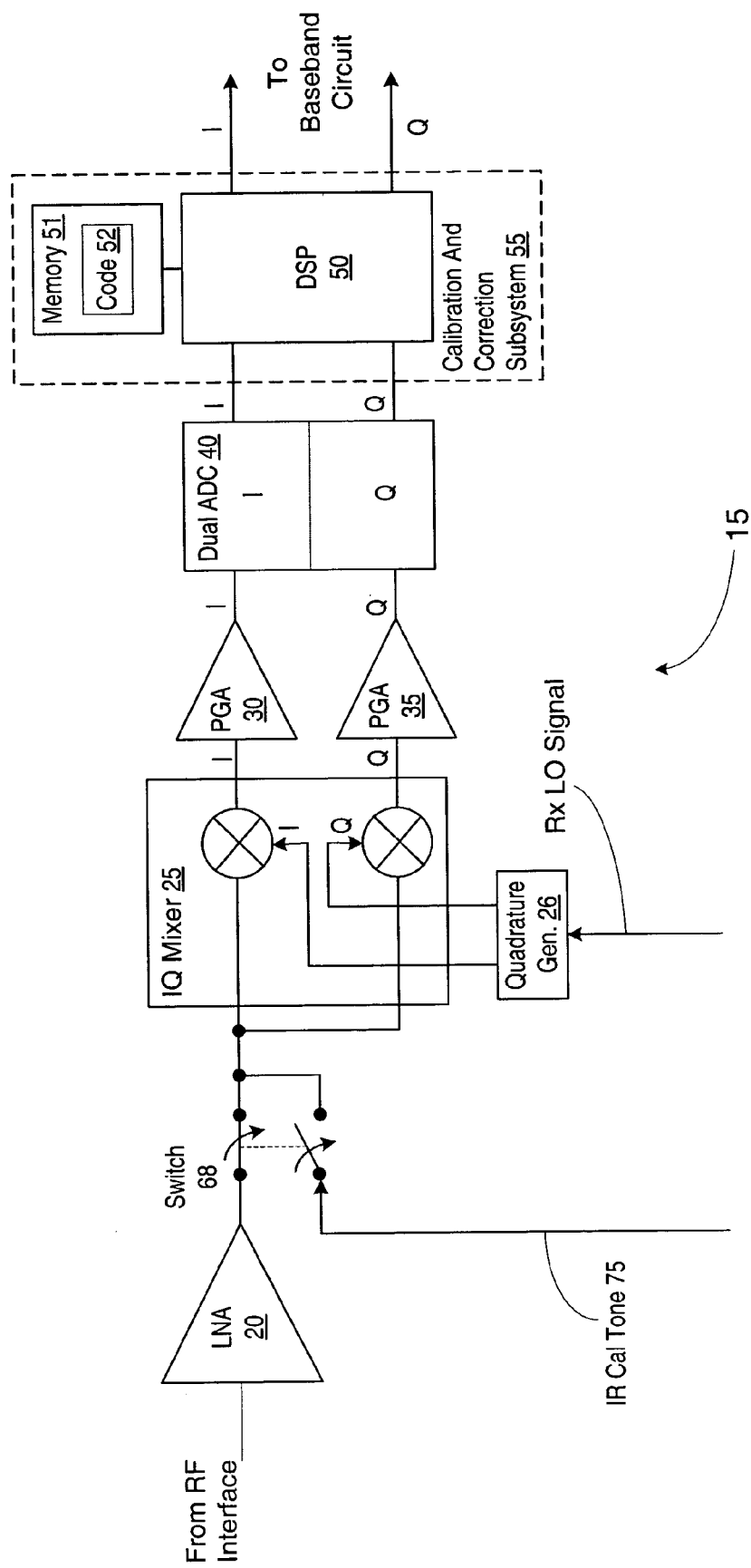
FIG. 1 is a block diagram of one embodiment of a receiver system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Overview of System and Image Phenomenon

Turning now to FIG. 1, a block diagram of one embodiment of a receiver system 15 is shown. Receiver system 15 may be configured to operate within a wireless communication device, such as a cellular telephone handset or a wireless data modem, for example. Additionally, receiver system 15 may be configured to implement one or more specific communication protocols or standards, such as the Global System for Mobile Communications (GSM) standard, the Personal Communications Service (PCS) standard, the Digital Cellular System (DCS) standard, the General Packet Radio Service (GPRS) standard, and/or the Enhanced General Packet Radio Service standard (E-GPRS, which may also be referred to as the Enhanced Data for GSM Evolution (EDGE) standard), for example. In general, receiver subsystem 15 may be configured to receive an incoming radio frequency (RF) signal from an RF interface (not shown), which may include elements such as an antenna, filters, and amplifier stages. Receiver subsystem 15 may also be configured to down-convert the frequency of the received RF signal and to provide the down-converted signal to a baseband circuit (not shown) for demodulation and decoding of the signal.

In some embodiments, receiver system 15 may be a subsystem of a transceiver that may further include a transmitter subsystem (not shown). Such a transmitter subsystem may be configured to receive a modulated baseband signal from a baseband circuit and to generate a modulated carrier at the higher intermediate frequency (IF). The transmitter subsystem may also be configured to up-convert the resultant IF signal and provide a modulated radio frequency (RF) output signal to the RF interface, which may include transmission power amplifiers and filters in addition to RF reception elements.

In the illustrated embodiment, receiver system 15 includes a low noise amplifier (LNA) 20 and an image rejection (IR) calibration tone 75. The output of LNA 20 and IR calibration tone 75 are each mutually exclusively coupled through a switch 68 to an in-phase/quadrature (IQ) mixer 25. Receiver system 15 is also coupled to receive a receiver local oscillator (RX LO) signal coupled to a quadrature generator 26. Quadrature generator 26 is coupled to provide quadrature LO signals to IQ mixer 25. The in-phase (I) and quadrature (Q) outputs of IQ mixer 25 are coupled to programmable gain amplifiers (PGAs) 30 and 35, respectively. PGAs 30 and 35 are coupled to a dual analog-to-digital converter (ADC) 40, which is in turn coupled to a calibration and correction subsystem 55. In the illustrated embodiment, calibration and correction subsystem 55 includes a digital signal processor (DSP) 50 coupled to a memory 51. In one embodiment, receiver system 15 may be implemented as a single integrated circuit (IC).

As described above, receiver system 15 may receive modulated signals at an RF frequency from the RF interface and provide the modulated signals at a lower frequency to the baseband circuits. In the illustrated embodiment, receiver system 15 is configured to heterodyne or mix the received RF signal with the receiver local oscillator signal, resulting in the received RF signal being converted to an intermediate frequency (IF) prior to being converted to a baseband frequency.

During normal operation of receiver system 15, LNA 20 may receive and amplify the incoming RF signal. The amplified RF signal is applied to both the I and Q portions of IQ mixer 25. Quadrature generator 26 receives the RX LO signal and generates quadrature LO signals for use by IQ mixer 25. IQ mixer 25 may be configured to mix the incoming modulated RF signal with the quadrature LO signals to produce a modulated I and Q signal pair at an IF frequency. The I and Q signal pair is conveyed to the remaining portions of receiver system 15 in I and Q channels. It is noted that as used herein, any device that generates or propagates an I and Q signal pair may be referred to as an IQ signal source relative to a device that consumes or sinks an I and Q signal pair. Thus, for example, IQ mixer 25 may be referred to as an IQ signal source, as may PGAs 30 and 35 taken together, or ADC 40.

The modulated I and Q signal pair is amplified by PGAs 30 and 35 and input into respective portions of the dual ADC 40. In one embodiment, dual ADC 40 may include a pair of delta-sigma converters configured to convert the I and Q signals into respective I and Q bit streams which are input into DSP 50 of calibration and correction subsystem 55 for processing. It is noted that although quadrature generator 26 is shown as a separate block, it is contemplated that quadrature generator 26 may be part of IQ mixer 25. Likewise, in alternative embodiments, the function of PGAs 30 and 35 may be incorporated into IQ mixer 25 or ADC 40, or the functions of IQ mixer 25, PGAs 30 and 35, and ADC 40 may be combined in a single circuit. Further, in some embodiments, each illustrated element of receiver system 15 may be included as part of a single integrated circuit.

As described in greater detail below in conjunction with the descriptions of FIGS. 8 and 9, receiver system 15 may also operate in a calibration mode. In the calibration mode, IQ mixer 25 of receiver system 15 may receive and mix a calibration tone 75 from a calibration tone generator (not shown) rather than the incoming RF signal. For this purpose, switch 68 may be configured to couple calibration tone 75 to IQ mixer 25 in place of the output of LNA 20 during the calibration mode of operation.

The modulated IF signal produced by mixing the received RF signal with the RX LO signal includes a useful signal and an image of the useful signal. The image may interfere with processing of the useful signal and may need to be suppressed. In the illustrated embodiment, calibration and correction subsystem 55 is configured to perform such image suppression. In one embodiment, DSP 50 of calibration and correction subsystem 55 may execute instructions and/or access data represented as code 52 stored within memory 51. As described in greater detail below, in one embodiment code 52 may include algorithms that, when executed by DSP 50, may cancel the residual image dependent upon one or more correction parameters. Additionally, in one embodiment code 52 may further include algorithms that, when executed by DSP 50, may determine whether any residual image frequencies remain in the I and Q signals and may determine the one or more correction parameters for canceling the residual image.

It is noted that memory 51 may be a random access memory (RAM) device that is a separate device from DSP 50. However, it is contemplated that any type of volatile or nonvolatile memory may be used. Further, in other embodiments, memory 51 may be part of (i.e., in the same integrated circuit package as) DSP 50. Similarly, as stated previously, all of the elements of receiver system 15 may be implemented as part of a single integrated circuit.

It is also noted that while the depicted embodiment includes a DSP 50, memory 51, and code 52, in alternative embodiments, the functions and algorithms described further below of calibration and correction subsystem 55 may be implemented using other types of devices, such as general-purpose microprocessors, application-specific integrated circuits (ASICs), or hardcoded custom logic, for example.

Figure 2:
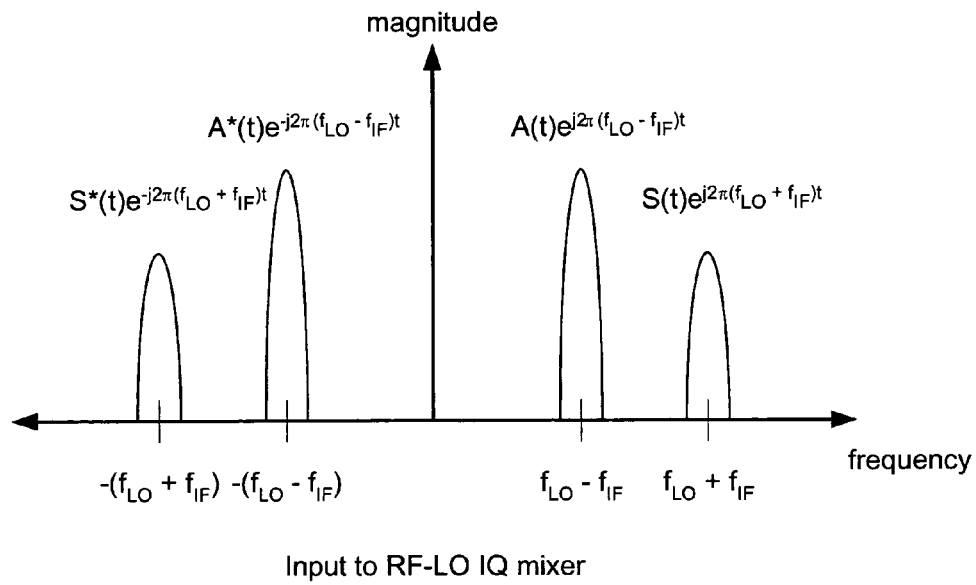
FIG. 2 illustrates the phenomenon of imaging in one embodiment of a receiver system.
Figure 2:
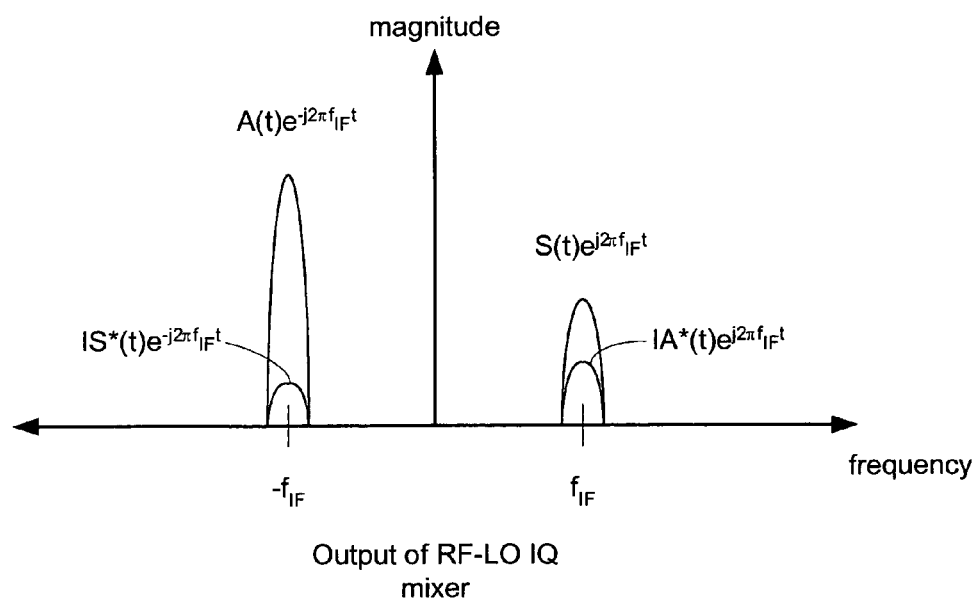

FIG. 2 illustrates the phenomenon of imaging in one embodiment of receiver system 15. Specifically, FIG. 2 illustrates the spectral distribution of an exemplary combination of signals at the input to and output of IQ mixer 25. At the input to IQ mixer 25, the signal of interest, whose complex baseband representation is S(t), may be present at a frequency $f_{LO}+f_{IF}$ while an unrelated signal, whose complex baseband representation is A(t), may be present at the image frequency of S, $f_{LO}-f_{IF}$. In one embodiment, $f_{IF}$ may be chosen to be the same frequency as the channel spacing frequency for a particular RF communication standard, such as 200 kHz. In such an embodiment, signal A may represent a signal in a different channel than signal S and may have a larger magnitude than signal S. In the illustrated example, signal A is two channels removed from signal S and may be referred to as an alternate channel signal relative to signal S. As signals S and A are complex, conjugate signal versions S* and A* exist in the negative frequency plane at frequencies $-(f_{LO}+f_{IF})$ and $-(f_{LO}-f_{IF})$, respectively.

Generally speaking, mixing or mathematically multiplying a given signal with a frequency conversion signal (such as a single-frequency tone, for example) results in a new signal having frequencies corresponding to sums and differences of the given signal's frequencies with the frequencies of the frequency conversion signal. Thus, mixing signals S and A and their conjugates with the RX LO signal at $f_{LO}$ in IQ mixer 25 results in signals at frequencies corresponding to the sums and differences of the original signal frequencies with $f_{LO}$. As shown in the diagram illustrating the spectral distribution at the output of IQ mixer 25, this results in signal S and signal A being translated to $f_{IF}$ and $-f_{IF}$, respectively. (Such mixing also results in high-frequency terms on the order of $2f_{LO}$ that subsequently may be filtered from the mixer output.) However, addition of $f_{LO}$ to the negative frequencies corresponding to signals S* and A* results in image signal A* being mixed onto signal S and conversely, image signal S* being mixed onto signal A. As illustrated in FIG. 2, the conjugate components are attenuated by a native image rejection factor I, such that the magnitude of A* is reduced in the process of mixing it onto signal S. In an ideal quadrature receiver system lacking gain or phase differences between the I and Q signal paths (i.e., a system in which, for example, IQ mixer 25 and all downstream components such as PGAs 30 and 35 and dual ADC 40 are perfectly balanced), native image rejection factor I may be zero, resulting in no mixing of image signals onto desired signals. However, in real receiver systems, gain and phase imbalances may limit native image rejection to the point where an image signal interferes unacceptably with the signal of interest.

Mathematically, the function of IQ mixer 25 as illustrated in FIG. 2 may be represented as:

$$y(t)=S(t)e^{j2\pi f_{IF}t}+IA^*(t)e^{j2\pi f_{IF}t}+A(t)e^{-j2\pi f_{IF}t}+IS^*(t)e^{j2\pi f_{IF}t}$$

where the first term represents the signal of interest S mixed to the frequency $f_{IF}$, the second term represents the image signal A* attenuated by native image rejection factor I and mixed to the frequency $f_{IF}$, the third term represents unrelated signal A mixed to the frequency $-f_{IF}$, and the fourth term represents the image signal S* attenuated by native image rejection factor I and mixed to the frequency $-f_{IF}$.

Image Rejection Techniques and Image Correction Factor

Figure 3A:
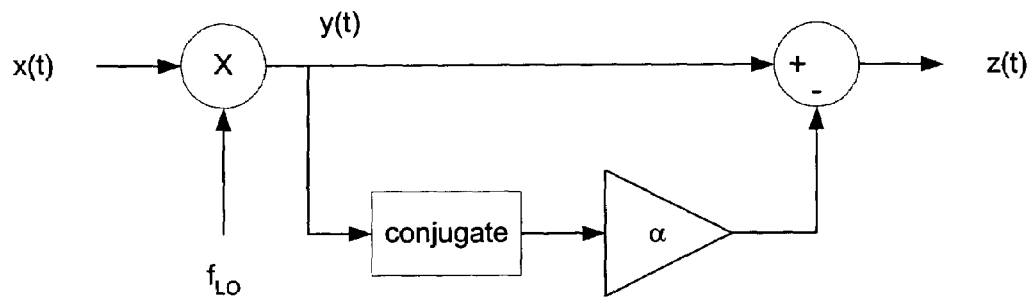
FIG. 3A is a mathematical flow diagram showing the application of a complex image correction factor to correct a nonzero native image rejection factor.

The mathematical function of IQ mixer 25 suggests that if native image rejection factor I could be made close to zero, mixing of image signals onto signals of interest may be significantly reduced. In some embodiments, native image rejection factor I may be reduced by directly reducing the phase and gain imbalances of the various components in the signal path that tend to increase I as described above. In other embodiments, native image rejection factor I may be reduced mathematically by applying a correction factor. FIG. 3A illustrates a mathematical flow diagram showing the application of a complex image correction factor to correct a nonzero native image rejection factor. It is noted that the terms complex image correction factor, image correction factor, image rejection correction factor, and complex correction factor may be used interchangeably herein. In FIG. 3A, complex input signal x(t) representing the combination of signal of interest S and unrelated signal A is mixed with the RX LO signal to yield the mixer output y(t) as described above. Subsequently, y(t) is conjugated and multiplied by a complex correction factor α, and the resulting product is subtracted from y(t) to form an image-corrected signal z(t).

Mathematically, the operations illustrated in FIG. 3A may be represented as:

$$z(t)=y(t)-\alpha y^*(t)$$

where y(t) is as given above. Substituting terms of y(t) and expanding gives:

$$z(t)=S(t)e^{j2\pi fIFt}+IA^*(t)e^{j2\pi fIFt}+A(t)e^{-j2\pi fIFt}+IS^*(t)e^{-j2\pi fIFt}-\alpha S^*(t)e^{-j2\pi fIFt}-\alpha I^*A(t)e^{-j2\pi fIFt}-\alpha A^*(t)e^{j2\pi fIFt}-\alpha IS(t)e^{j2\pi fIFt}.$$

Collecting terms and disregarding the negative frequency terms gives approximately $$z(t)\approx S(t)e^{j2\pi fIFt}+(I-\alpha)A^*(t)e^{j2\pi fIFt}$$

from which can be seen that if complex correction factor α can be chosen to be a value close to native image rejection factor I, performing the operations shown in FIG. 3A may result in reduction or elimination of the unwanted image signal component interfering with the signal of interest during conversion of the received RF signal to the IF.

In some embodiments, complex correction factor α may be applied to a signal in the digital domain. For example, in the embodiment of receiver system 15 illustrated in FIG. 1, complex correction factor α may be applied by DSP 50 of calibration and correction subsystem 55 after ADC 40 has converted the amplified I and Q outputs of IQ mixer 25 from an analog to a digital representation. In the embodiment of receiver system 15 illustrated in FIG. 1, the I and Q signals explicitly represent the real and imaginary portions of the complex output of IQ mixer 25. The expression for z(t) above may be modified to make the operations on the real and imaginary portions of y(t) more explicit as follows:

$$z(t)=y_r(t)+jy_i(t)-(\alpha_r+j\alpha_i)(y_r(t)-jy_i(t))$$

Distributing and collecting terms gives:

$$z(t)=(1-\alpha_r)y_r(t)+j(1+\alpha_r)y_i(t)-\alpha_i y_i(t)-j\alpha_i y_r(t).$$

Figure 3B:
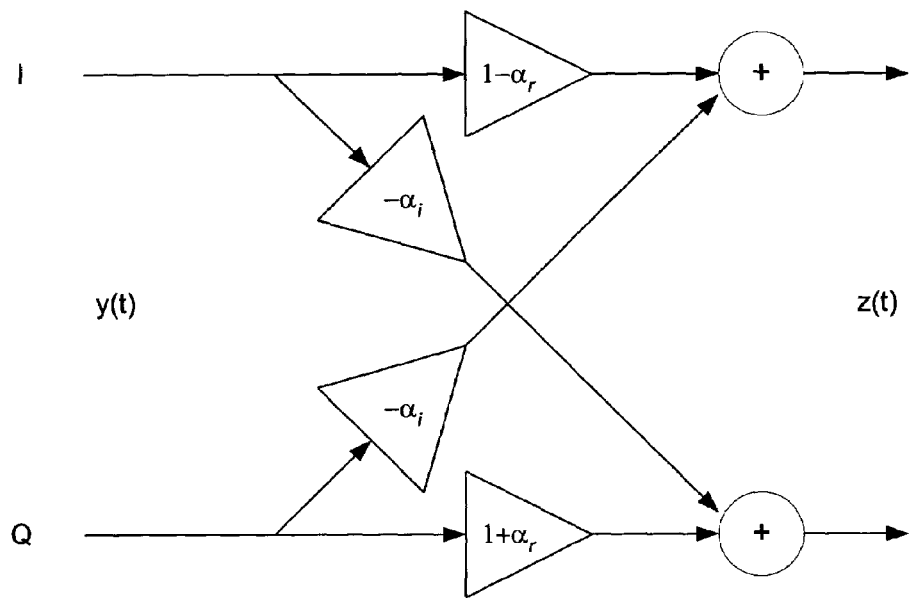
FIG. 3B is a dataflow diagram illustrating one embodiment of applying a complex image correction factor to a digital signal including I and Q components.

FIG. 3B is a dataflow diagram illustrating one embodiment of applying a complex image correction factor to a digital signal including I and Q components. The input to the dataflow diagram, y(t), includes respective real and imaginary components I and Q corresponding to $y_r(t)$ and $y_i(t)$ in the above expression of z(t). The dataflow diagram illustrates that the I component is multiplied by a first function of the real portion of complex correction factor α and accumulated with the result of multiplying the Q component by a second function of the imaginary portion of complex correction factor α. The result of this accumulation forms the I component of dataflow output z(t). Similarly, the Q component is multiplied by a second function of the real portion of complex correction factor α and accumulated with the result of multiplying the I component by a first function of the imaginary portion of complex correction factor α. The result of this accumulation forms the Q component of dataflow output z(t). In the illustrated embodiment, data from the real portion of the input signal (i.e., the I component) is modified and accumulated into the imaginary portion of the output signal (i.e., the Q component). Likewise, data from the imaginary portion of the input signal is modified and accumulated into the real portion of the output signal. An operation in which data is exchanged between parallel paths such as illustrated in the dataflow diagram embodiment of FIG. 3B may be referred to herein as a cross-accumulation or a butterfly operation.

In the illustrated embodiment, the aforementioned first functions of the real and imaginary portions of complex correction factor α are $1-\alpha_r$ and $-\alpha_i$, respectively, while the aforementioned second functions of the real and imaginary portions of complex correction factor α are $1+\alpha_r$ and $-\alpha_i$, respectively. However, it is contemplated that in other embodiments, other functions of complex correction factor α may be employed. It is further contemplated that in some embodiments, complex correction factor α may be represented in a different form, or as a function rather than a constant. For example, in some embodiments the native image rejection factor I of receiver system 15 of FIG. 1 may vary over time due to environmental or configuration changes, such as changes in temperature or mode of operation. Correspondingly, in such an embodiment complex correction factor α may be configured to vary according to similar conditions, for example as a function of temperature or operation mode. Additionally, in some embodiments the native image rejection factor I may vary dependent on frequency, such as the frequencies of carrier signals in different bands of receiver operation or the frequencies of different channels near a given carrier frequency in a given band of receiver operation, for example. Native image rejection factor I may further vary over the bandwidth of a single channel. In such embodiments, complex correction factor α may be configured to vary according to frequency. For example, different complex correction factor values may be used in different bands or channels of operation, and/or the complex correction factor may be configured to vary over the bandwidth of a single channel.

In one embodiment, the operations shown in the dataflow diagram embodiment of FIG. 3B may be implemented in DSP 50 of FIG. 1 as a sequence of multiply and accumulate operations. In an alternative embodiment, ADC 40 of FIG. 1 may be configured to produce respective serial bit streams for each of the I and Q components, where each bit stream comprises a sequence of bits. For example, ADC 40 may be implemented using a delta-sigma modulator configured to perform analog to digital conversion by producing a serial bit stream in which each bit indicates a value +1 or −1. In such an embodiment, more complex multiplication operations may be replaced by less complex arithmetic operations. Specifically, multiplication of the I and Q components by relevant portions of the complex image correction factor may be effected by changing the sign of the relevant portion of the complex image correction factor dependent upon the value indicated by a bit of the bit stream. For example, if the imaginary portion of the complex image correction factor is a 14-bit quantity, multiplication of the I component of a digital signal by the imaginary portion of the complex image correction factor may be performed in one embodiment by testing a bit of the I component bit stream, preserving the sign of the 14-bit quantity if the tested bit indicates a +1 value, and complementing the sign of the 14-bit quantity if the tested bit indicates a −1 value. In one embodiment, complementing the sign of a relevant portion of a complex image correction factor represented in two's complement form may be realized exactly by performing a two's complement operation. In an alternative embodiment, an exact complement may not be required, and complementing the sign of a two's complement number may be implemented using a one's complement operation.

Alternative simplifications of multiplication operations using properties of serial bit stream digital signal encodings are possible and contemplated. For example, in one embodiment the each bit of a serial bit stream may indicate a 1 or 0 value. In such an embodiment, multiplication of the I and Q components by relevant portions of the complex image correction factor may be effected by performing a logical AND function between a bit of the I or Q component bit stream and each bit of the relevant portion of the complex image correction factor. For example, if the imaginary portion of the complex image correction factor is a 14-bit quantity, multiplication of the I component of a digital signal by the imaginary portion of the complex image correction factor may be performed by logically ANDing one bit of the I component bit stream with each of the 14 bits of the imaginary portion of the complex image correction factor.

It is noted that other embodiments are contemplated in which the application of a complex image correction factor to a signal may be performed by devices other than a DSP. For example, in some embodiments the illustrated operations may be performed by a general purpose microprocessor or by custom logic. Generally speaking, calibration and correction subsystem 55 of FIG. 1 may include any type of logic device that may be configured to combine a digital signal with a complex image correction factor as described above. Calibration and correction subsystem 55 may also be referred to herein as an image correction unit.

Baseband Recovery Mixing and Image Correction

As illustrated in FIGS. 1 and 2, after a received signal has been mixed with the RX LO signal in IQ mixer 25, the resulting signal produced at the output of IQ mixer 25 is at an intermediate frequency $f_{IF}$ that is the difference between the frequency of the received RF signal $f_{RF}$ and the LO frequency $f_{LO}$. As described above, the output of IQ mixer 25 may also include an image signal as well as high-frequency terms resulting from the mixing with the RX LO signal. Additional processing of the IF signal may be necessary before information encoded in the baseband signal (i.e., the original signal prior to modulation by a carrier frequency) may be decoded.

Figure 4:
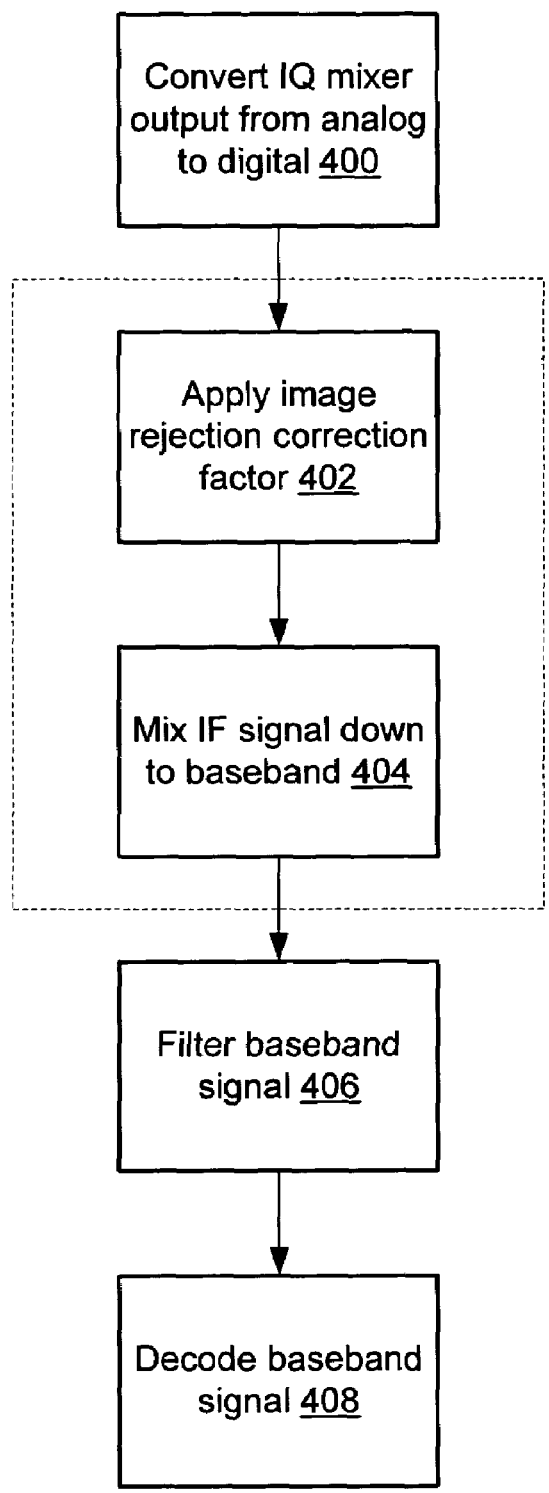
FIG. 4 is a flow diagram illustrating the operation of one embodiment of a digital receiver system.

FIG. 4 is a flow diagram illustrating the operation of one embodiment of a digital receiver system. Referring collectively to FIGS. 1, 3B, and 4, operation begins in block 400 where the output of IQ mixer 25, as amplified by PGAs 30 and 35, is converted from analog to digital by ADC 40. Calibration and correction subsystem 55 may be configured to receive the digital representation of the I and Q components and to apply an image correction factor to these components (block 402). In one embodiment, calibration and correction subsystem 55 may be configured to combine the I and Q components of the digital IF signal with a complex image correction factor in a butterfly operation such as that illustrated in FIG. 3B.

After applying the image correction factor, calibration and correction subsystem 55 may be configured to digitally mix the I and Q components of the digital IF signal down to a baseband signal frequency (block 404). In one embodiment, this mixing may occur by combining the digital output of the image correction factor application with a signal at the IF frequency in a direct digital frequency synthesizer (DDFS) as described further below in conjunction with the description of FIG. 5.

After the digital signal has been mixed down to baseband, calibration and correction subsystem 55 may be configured to filter the baseband result (block 406). For example, high-frequency components introduced during the mixing process or the conversion from analog to digital may be removed using low-pass filters. The filtered baseband signal may then be decoded to obtain information originally encoded into it (block 408). For example, digital information corresponding to sampled audio data may be decoded from the baseband signal.

It is noted that in some embodiments, filtering may take place at a different point during signal processing than after the image correction and baseband mixing steps. Further, as described in greater detail below, in conjunction with the description of FIGS. 6A and 6B, in some embodiments the application of the image correction factor of block 402 may be combined with the mixing of the digital IF signal down to baseband of block 404.

Figure 5:
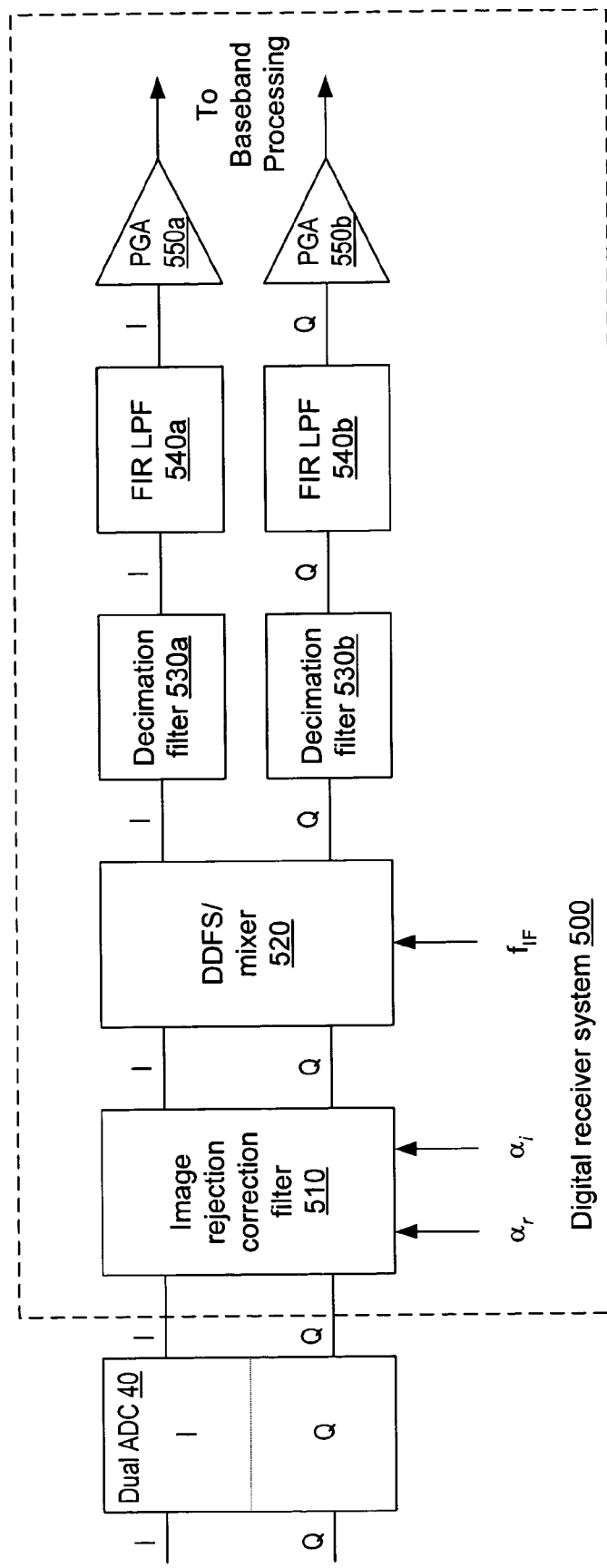
FIG. 5 is a block diagram illustrating one embodiment of a digital receiver system.

FIG. 5 is a block diagram illustrating one embodiment of a digital receiver system. In the illustrated embodiment, digital receiver system 500 is coupled to receive I and Q components of a digital signal from ADC 40 of receiver 15. Digital receiver system 500 includes an image rejection correction filter 510 coupled to receive I and Q components of a digital signal as well as real and imaginary components $\alpha_r$ and $\alpha_i$ of a complex image correction factor. A direct digital frequency synthesizer (DDFS)/mixer 520 is coupled to receive the output of image rejection correction filter 510 and an IF frequency signal $f_{IF}$. The I component output of DDFS/mixer 520 is coupled to a decimation filter 530a, which is coupled in turn to a finite impulse response low pass filter (FIR LPF) 540a and a programmable gain amplifier (PGA) 550a. The Q component output of DDFS/mixer 520 is coupled to a decimation filter 530b, which is coupled in turn to an FIR LPF 540b and a PGA 550b. The I and Q outputs of PGAs 550a and 550b, respectively, are coupled to additional circuitry (not shown) configured to perform processing of the information content of the baseband signal.

It is noted that in one embodiment, digital receiver system 500 may be implemented wholly within calibration and correction subsystem 55 of receiver 15 of FIG. 1, for example as a set of software routines stored in memory 51 and executed by DSP 50. In other embodiments, it is contemplated that the elements of digital receiver system 500 may be implemented in different types of circuits, such as general purpose microprocessors or discrete logic circuits, for example.

Image rejection correction filter 510 may be configured to combine the I and Q components of the received digital signal with the received complex correction factor as described above. In one embodiment, image rejection correction filter 510 may be configured to implement a butterfly operation such as illustrated in FIG. 3B.

DDFS/mixer 520 may be configured to mix the image-corrected digital IF output signal of image rejection correction filter 510 down to baseband by multiplying the I and Q components of the image-corrected digital signal at IF with a digital signal representing the intermediate frequency itself at $f_{IF}$. In one embodiment, the digital signal representing the intermediate signal may be a digitally sampled representation of $f_{IF}$, for example at the same sample rate used by ADC 40. Mathematically, the mixing operation of DDFS/mixer 520 is similar to that of IQ mixer 25 illustrated in FIG. 1, in that the result of the mixing yields signals at frequencies corresponding to the sum and difference of the input signal with $f_{IF}$. Thus in an embodiment using an IF of 200 kHz, for example, the output of DDFS/mixer 520 may include the image-corrected digital signal at baseband (i.e., DC), represented as I and Q components. As noted above, in some embodiments the operation of image rejection correction filter 510 and DDFS/mixer 520 may be combined; such a combined operation is described in greater detail below in conjunction with the description of FIGS. 6A and 6B.

In some embodiments, the digital signal produced at the output of DDFS/mixer 520 may be oversampled relative to the baseband information content. For example, a relatively high sample frequency may be used at ADC 40 to preserve information about high frequency components in the digital signal prior to image correction and mixing to baseband, but such information may no longer be relevant following these steps. The illustrated embodiment of digital receiver system 500 includes decimation filters 530a and 530b to reduce the sample frequency of the respective I and Q components of the digital signal output of DDFS/mixer 520. In one embodiment, decimation filters 530a and 530b may be configured to perform an anti-aliasing low pass filtering to remove undesired high-frequency components that could potentially alias to lower frequencies during decimation. Decimation filters 530a and 530b may be configured to then reduce the sample frequency of an input signal by discarding a fraction of the data samples comprising the input signal. For example, a decimation filter may periodically or aperiodically discard data samples such that, on average, one of every four of data samples of the input signal is retained.

As noted above, high frequency components may be introduced into the received signal at various points during processing. For example, the mixing that occurs in IQ mixer 25 and DDFS/mixer 520 may introduce components at roughly twice the LO and IF frequencies due to the properties of multiplicative signal mixing described above. Additionally, high frequency noise may be introduced during conversion of the signal from analog to digital or during other digital filtering steps. Much of this noise may be filtered by the anti-aliasing low pass filter function of decimation filters 530a and 530b described above. However, in some embodiments, the filtering requirements to prevent aliasing resulting from decimation may not reject noise to the degree required for baseband processing. For example, the anti-aliasing low pass filter may have a relatively high cutoff frequency and a gradual rather than sharp frequency response, whereas the baseband processing circuitry may require a more narrowly filtered input signal. Therefore, in the illustrated embodiment of digital receiver system 500, finite impulse response low pass filters (FIR LPFs) 540a and 540b are provided to filter out undesired high-frequency signal components from the I and Q components, respectively. In one embodiment, FIR LPFs 540a and 540b may be configured to select frequencies that are within the bandwidth of the baseband channel and to reject frequencies above that channel with a relatively sharp frequency response. FIR LPFs 540a and 540b may also be referred to herein as channelization filters. It is noted that in other embodiments, different filter types may be used as channelization filters, such as infinite impulse response (IIR) filters, for example.

Prior to being conveyed to baseband processing logic for further decoding, the level of the filtered digital signal may be amplified. In the illustrated embodiment of digital receiver system 500, programmable gain amplifiers (PGAs) 550a and 550b may be configured to amplify the I and Q components received from FIR LPFs 540a and 540b, respectively. In one embodiment, PGAs 550a and 550b may be configured to amplify a respective digital signal by scaling it according to a programmable scaling factor. Such a scaling factor may also be referred to herein as a gain.

Figure 6A:
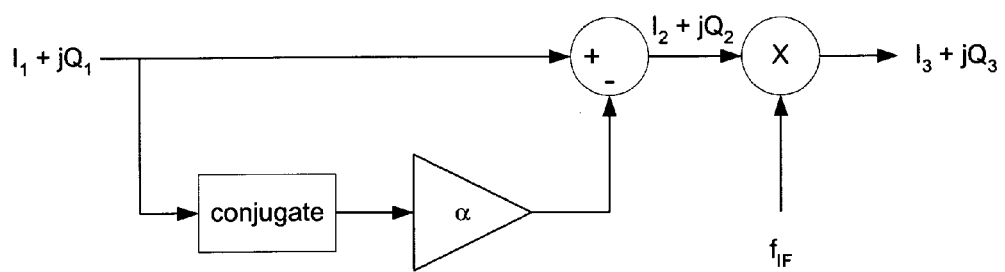
FIG. 6A is a mathematical flow diagram showing the application of a complex image correction factor to a digital signal followed by a mixing operation.

As noted above, in one embodiment the functions of image rejection correction filter 510 and DDFS/mixer 520 may be combined into a single butterfly operation, thereby potentially reducing the logic resources or the number of operations needed to implement these functions. FIG. 6A illustrates a mathematical flow diagram showing the application of a complex image correction factor to a digital signal followed by a mixing operation. In FIG. 6A, a complex input signal $I_1+jQ_1$ representing the digital signal received from ADC 40 is conjugated and multiplied by a complex correction factor $\alpha$, and the resulting product is subtracted from $I_1+jQ_1$ to form a complex image-corrected signal $I_2+jQ_2$ that may correspond to the output of image rejection correction filter 510 in the embodiment illustrated in FIG. 5. Subsequently, the complex image-corrected signal $I_2+jQ_2$ is mixed with the IF frequency $f_{IF}$ to yield the baseband signal $I_3+jQ_3$, which may correspond to the output of DDFS/mixer 520 as described above.

Using the form of z(t) derived above in the description of the butterfly operation illustrated in FIG. 3B and separating terms into the I and Q components, the operations shown in FIG. 6A may be mathematically represented as:

$$I_2(n) = (1-\alpha_r)I_1(n) - \alpha_i Q_1(n)$$

$$Q_2(n) = (1+\alpha_r)Q_1(n) - \alpha_i I_1(n)$$

where n denotes time in the digital domain. Further, $$I_3(n) + jQ_3(n) = (I_2(n) + jQ_2(n))e^{-jkn}$$

where k is a constant representing the frequency of the frequency conversion signal in radians/sample. In one embodiment, k may be represented as a ratio of a conversion frequency ($f_{IF}$ as illustrated in FIG. 6A) to the sampling frequency of the digital system:

$$k = \frac{2\pi f_{conversion}}{f_{sample}}.$$

Substituting trigonometric functions for the complex exponential term and expanding yields:

$$I_3(n)+jQ_3(n) = I_2 \cos(kn) + Q_2 \sin(kn) - jI_2 \sin(kn) + jQ_2 \cos(kn)$$

and substituting $I_1+jQ_1$ and separating the real and complex terms gives:

$$I_3(n) = [(1-\alpha_r)\cos(kn) - \alpha_i \sin(kn)]I_1(n) + [(1+\alpha_r)\sin(kn) - \alpha_i \cos(kn)]Q_1(n)$$

$$Q_3(n) = [-(1-\alpha_r)\sin(kn) - \alpha_i \cos(kn)]I_1(n) + [(1+\alpha_r)\cos(kn) + \alpha_i \sin(kn)]Q_1(n)$$

which mathematically expresses the combination of the image cancellation operation and the mixing operation.

Figure 6B:
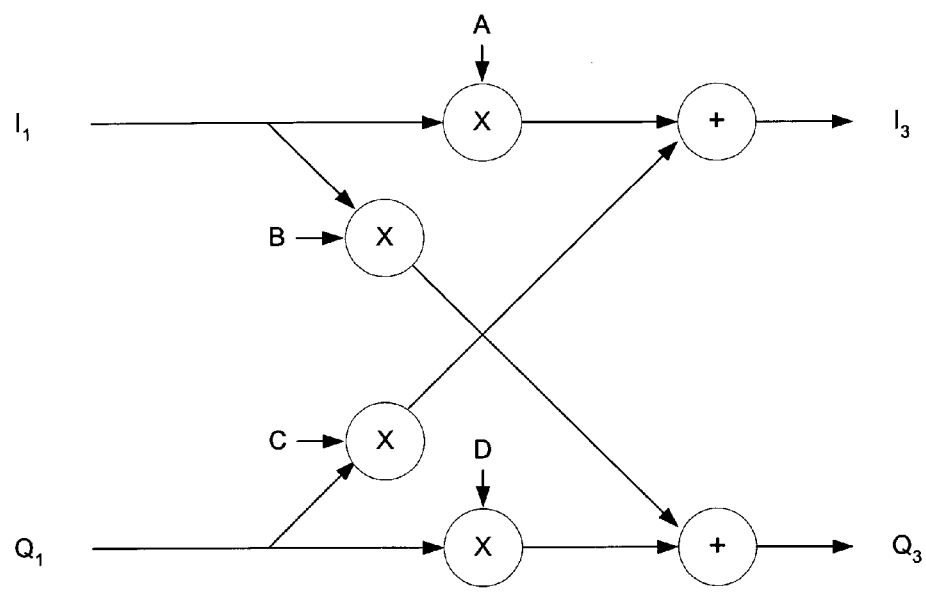
FIG. 6B is a dataflow diagram illustrating one embodiment of applying a combined complex image correction factor application and a mixing operation to a digital signal including I and Q components.

FIG. 6B is a dataflow diagram illustrating one embodiment of applying a combined complex image correction factor application and a mixing operation to a digital signal including I and Q components. In the illustrated embodiment, the input to the dataflow diagram includes respective real and imaginary components $I_1$ and $Q_1$ corresponding to those in the above expressions of $I_3(n)$ and $Q_3(n)$ and which are combined along with a complex image correction factor and a frequency conversion signal in a butterfly operation. The dataflow diagram illustrates that the $I_1$ component is multiplied by a first function A of complex correction factor $\alpha$ and a frequency conversion signal and accumulated with the result of multiplying the $Q_1$ component by a third function C of complex correction factor $\alpha$ and the frequency conversion signal. The result of this accumulation forms the $I_3$ component of the dataflow output. Similarly, the $Q_1$ component is multiplied by a fourth function D of complex correction factor $\alpha$ and the frequency conversion signal and accumulated with the result of multiplying the $I_1$ component by a second function B of complex correction factor $\alpha$ and the frequency conversion signal. The result of this accumulation forms the $Q_3$ component of the dataflow output.

In the illustrated embodiment, the aforementioned first, second, third, and fourth functions of complex correction factor $\alpha$ and the frequency conversion signal are:

$$A(\alpha,k,n) = (1-\alpha_r)\cos(kn) - \alpha_i \sin(kn)$$

$$B(\alpha,k,n) = -(1-\alpha_r)\sin(kn) - \alpha_i \cos(kn)$$

$C(\alpha,k,n)=(1+\alpha_r)\sin(kn)-\alpha_i \cos(kn)$ $D(\alpha,k,n)=(1+\alpha_r)\cos(kn)+\alpha_i \sin(kn)$ corresponding to the terms modifying the $I_1$ and $Q_1$ terms in the relations for $I_3(n)$ and $Q_3(n)$ given above. However, it is contemplated that in other embodiments, other functions of complex correction factor α and other representations of the frequency conversion signal may be employed. As noted above, it is further contemplated that in some embodiments, complex correction factor α may be represented in a different form, or as a function rather than a constant.

In one embodiment, the operations shown in the dataflow diagram embodiment of FIG. 6B may be implemented within digital receiver system 500 of FIG. 5 as a sequence of multiply and accumulate operations. For example, in one embodiment digital receiver system 500 may be implemented as a set of instructions executed on a processor such as DSP 50 of FIG. 1. Alternatively, digital receiver system 500 may be implemented using custom or hardwired logic circuits. In some embodiments, functions A, B, C, and D shown in FIG. 6B may be periodic functions that are not themselves dependent upon the input signal. In such embodiments, digital receiver system 500 may be configured to store a precomputed period of each of functions A, B, C, and D, for example in a lookup table or array, thereby reducing the number of mathematical operations required to evaluate each instance of the butterfly operation of FIG. 6B, which may in turn reduce the latency and digital switching noise associated with such evaluation. Further, in some embodiments periodic functions A, B, C, and D may exhibit symmetry such that the full period may be readily obtained from a portion of the full period. For example, a full period of a sinusoidal function may be obtained from a half or quarter period of the function through appropriate transformations about each axis of the plane of the function. In such embodiments, digital receiver system 500 may be configured to store a precomputed portion of a period of each of functions A, B, C, and D, thereby reducing the storage medium requirements associated with storing such precomputed functions.

In one embodiment, ADC 40 of FIG. 5 may be configured to produce respective serial bit streams for each of the I and Q components, where each bit stream comprises a sequence of bits. For example, ADC 40 may be a delta-sigma modulator configured to perform analog to digital conversion by producing a serial bit stream in which each bit indicates a value +1 or −1. In such an embodiment, more complex multiplication operations may be replaced by less complex arithmetic operations. Specifically, multiplication of the I and Q components by appropriate values of functions A, B, C, or D may be effected by changing the sign of the relevant portion of the function value dependent upon the value indicated by a bit of the bit stream. For example, if the function value is a 14-bit quantity, multiplication of the I component of a digital signal by the function value may be performed in one embodiment by testing a bit of the I component bit stream, preserving the sign of the 14-bit quantity if the tested bit indicates a +1 value, and complementing the sign of the 14-bit quantity if the tested bit indicates a −1 value. In one embodiment, complementing the sign of function value represented in two's complement form may be realized exactly by performing a two's complement operation. In an alternative embodiment, an exact complement may not be required, and complementing the sign of a two's complement number may be implemented using a one's complement operation.

Alternative simplifications of multiplication operations using properties of serial bit stream digital signal encodings are possible and contemplated. For example, in one embodiment the each bit of a serial bit stream may indicate a 1 or 0 value. In such an embodiment, multiplication of the I and Q components by appropriate values of functions A, B, C, or D may be effected by performing a logical AND function between a bit of the I or Q component bit stream and each bit of the function value. For example, if the function value is a 14-bit quantity, multiplication of the I component of a digital signal by the function value may be performed by logically ANDing one bit of the I component bit stream with each of the 14 bits of the function value.

Acquiring the Image Correction Factor

As described above, imbalances in the form of phase and gain differences between the I and Q paths of a receiver system lead to a nonzero native image rejection factor for which the complex image correction factor may compensate. In some embodiments, the complex image correction factor used in the receiver system may be a fixed value determined prior to operation of the system. For example, a complex image correction factor value may be programmed into the receiver system during the manufacturing process. In other embodiments, the receiver system may be configured to perform a calibration operation to dynamically determine the complex image correction factor to be used, a process which may also be referred to herein as acquiring an image correction factor.

Figure 7:
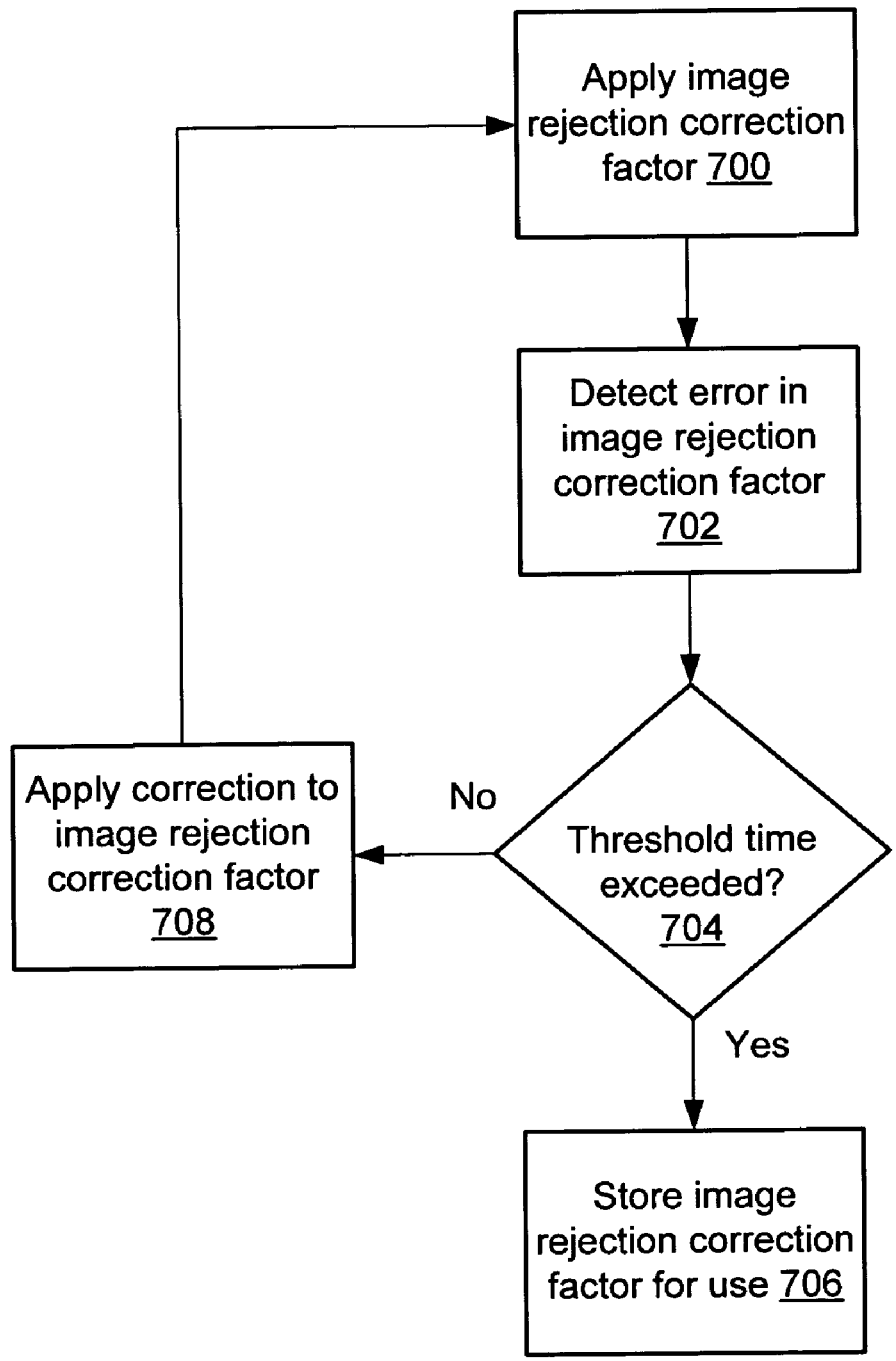
FIG. 7 is a flow diagram illustrating the operation of one embodiment of a system configured to perform image correction factor acquisition.

In some embodiments, image correction factor acquisition may be implemented as an iterative process. FIG. 7 is a flow diagram illustrating the operation of one embodiment of a system configured to perform image correction factor acquisition. Referring collectively to FIG. 2 and FIG. 7, operation begins in block 700 where an estimate of an image correction factor is applied during processing of an input signal S. In one embodiment, the image correction factor estimate may be applied using a butterfly operation such as described above in conjunction with the description of FIG. 3B. Further, in one embodiment the image correction factor estimate used during the first iteration of image correction factor acquisition may be a predetermined value as described above, while in other embodiments the initial estimate may be determined in other ways, such as by using a lookup table or choosing a random value, for example.

As FIG. 2 illustrates, if the native image correction factor I less the image correction factor estimate is nonzero, some component of an unwanted channel frequency may be mixed onto input signal S during system operation. In response to applying an estimate of the image correction factor, the error in the image correction factor estimate may be detected (block 702). In one embodiment, the error may correspond to the difference between the native image correction factor I and the complex image correction factor α, or I−α. In such an embodiment, the error may be greater than, less than, or equal to zero for each of the real and imaginary parts of the difference.

In order to determine when to terminate the iteration of image correction factor acquisition, a termination condition may be detected. In one embodiment, the system may iterate for a fixed period of time and then terminate. In such an embodiment, the iteration time may be compared against a threshold time to determine whether the threshold time has been exceeded (block 704). If the threshold time has been exceeded, the current estimate of the image correction factor may be stored for use during normal system operation (block 706). If the threshold time has not been exceeded, a correction may be applied to the image correction factor dependent on the error detected in block 702 (block 708). For example, the detected error may be added to the image correction factor. After the estimated image correction factor has been corrected, operation may proceed from block 700, where the updated estimate is again applied to the input signal S.

It is noted that in other embodiments, termination conditions other than time-based conditions are contemplated. For example, the system may iterate until the detected error achieves a particular threshold value. Further, it is noted that in other embodiments the termination condition may be tested at any point during the operation of an iteration. For example, the threshold value (whether elapsed time, error magnitude, or some other value) may be tested prior to image correction factor application or error detection.

In one embodiment, the input signal used during image correction factor acquisition may be a calibration tone. FIG. 8 is a flow diagram illustrating the operation of one embodiment of a system configured to perform image correction factor acquisition using a calibration tone. Referring collectively to FIG. 1 and FIG. 8, operation begins in block 800 where a calibration tone is applied to the system. In the embodiment of receiver system 15 illustrated in FIG. 1, image rejection calibration tone 75 may be applied to the input of IQ mixer 25 via switch 68 during a calibration mode of operation.

Additionally, during block 800 the calibration tone input may be mixed with the RX LO signal in IQ mixer 25, which may output the calibration tone mixed with the RX LO signal as a signal comprising separate I and Q components. These components may be amplified by PGAs 30 and 35 respectively, and converted from analog to digital via ADC 40. In one embodiment, the frequency of image rejection calibration tone 75 may be chosen to be $f_{LO}-f_{IF}$, such that mixing the calibration tone with the RX LO signal in IQ mixer 25 yields a tone at the intermediate frequency. In other embodiments, it is contemplated that different calibration tone frequencies may be chosen or the calibration tone frequency may be inexact, such that mixing the calibration tone with the RX LO signal in IQ mixer 25 may yield a tone at a frequency other than the intermediate frequency. In some embodiments, the frequency of the RX LO signal may drift or vary over time. In such embodiments, the calibration tone generator may be configured to track the variance of the RX LO signal and to vary the frequency of the calibration tone such that the calibration tone and the RX LO signal remain relatively invariant. Various implementations of suitable calibration tone generators are possible, including tone generators that employ phase locked loop circuits to lock onto the RX LO signal. Another specific structure for generating a calibration tone is described in co-pending U.S. patent application Ser. No. 10/673,905 filed concurrently and entitled "Receiver Including an Oscillation Circuit for Generating an Image Rejection Calibration Tone," which is hereby incorporated by reference in its entirety.

As noted above in the description of digital receiver system 500, a digital signal may be oversampled with respect to the information it contains. After the calibration tone has been applied to the image correction factor acquisition system and converted to a digital signal, a decimation filter may be applied to reduce the sample rate of the digital signal (block 802).

An ideal calibration tone, and thus the IF mixer output of the calibration tone with the LO frequency, may be a single-frequency tone. However, in a real system, harmonic distortion of the tone coupled with harmonic distortion in the LO signal and nonlinearity in IQ mixer 25 may generate undesired tones at other frequencies near the IF. To reduce the impact of harmonic distortion on the image correction factor acquisition process, a bandpass filter may be applied to the decimated input signal (block 804).

Following bandpass filtering, an estimate of the image correction factor may be applied to the calibration-tone-based input signal, and the result may be referred to herein as the corrected signal (block 806). In one embodiment, the image correction factor estimate may be applied using a butterfly operation such as described above in conjunction with the description of FIG. 3B. Further, as noted above in conjunction with the description of FIG. 7, in one embodiment the image correction factor estimate used during the first iteration of image correction factor acquisition may be a predetermined value, while in other embodiments the initial estimate may be determined in other ways, such as by using a lookup table or choosing a random value, for example. It is noted that in an alternative embodiment, the bandpass filtering described above in block 804 may occur subsequent to application of the image correction factor estimate.

Following application of the image correction factor estimate (or, in an alternative embodiment, following bandpass filtering if it occurs subsequent to application of the image correction factor estimate), the corrected signal may be mathematically squared (block 808). As described in further detail below in conjunction with the description of FIG. 10B, squaring is a nonlinear operation that may aid in detection of an error component in the corrected signal. It is noted that in other embodiments, other nonlinear operations may be used to aid in error component detection.

A notch filter configured to suppress frequencies other than the frequency of the desired error component of the corrected input signal may be applied to the squared corrected signal to select its error component (block 810). For example, in one embodiment, the squared corrected signal may exhibit an error component at a DC frequency. In such an embodiment, a notch filter may be configured to suppress harmonic components of the squared corrected signal, leaving the DC component. In an alternative embodiment, a highly selective bandpass filter may be employed to pass the DC component and reject other frequencies.

Following selection of the error component of the squared corrected signal, a gain of a programmable gain amplifier (PGA) may be selected (block 812). In one embodiment, the gain may be selected from a table or similar data structure indexed by the current elapsed time of the image correction factor acquisition process. In some embodiments, the gain selected may have different values during successive iterations of the acquisition process. As described in greater detail below in conjunction with the description of FIG. 9, selection of different gain values may enable the trajectory of the acquisition process to be optimized. It is noted that in other embodiments, gain selection may occur at other points during an iteration of the acquisition process.

Once the error component of the squared corrected signal and an appropriate PGA gain have been selected, the error component may be scaled by the PGA to determine an error correction amount, which may be a complex value (block 814). The error correction amount may then be accumulated into the estimate of the complex image correction factor (block 816).

In order to determine when to terminate the iteration of image correction factor acquisition, a termination condition may be detected. In one embodiment, iteration may continue for a fixed period of time and then terminate. In such an embodiment, the iteration time may be compared against a threshold time to determine whether the threshold time has been exceeded (block 818). If the threshold time has been exceeded, the current estimate of the image correction factor may be stored for use during normal system operation (block 820). If the threshold time has not been exceeded, operation may proceed from block 806, where the corrected estimate of the image correction factor is again applied to the calibration-tone-based input signal.

It is noted that in other embodiments, termination conditions other than time-based conditions are contemplated. For example, iteration may continue until the selected error component achieves a particular threshold value. Further, it is noted that in other embodiments the termination condition may be tested at any point during the operation of an iteration. For example, the threshold value (whether elapsed time, error magnitude, or some other value) may be tested prior to image correction factor application or error component selection.

Figure 8:
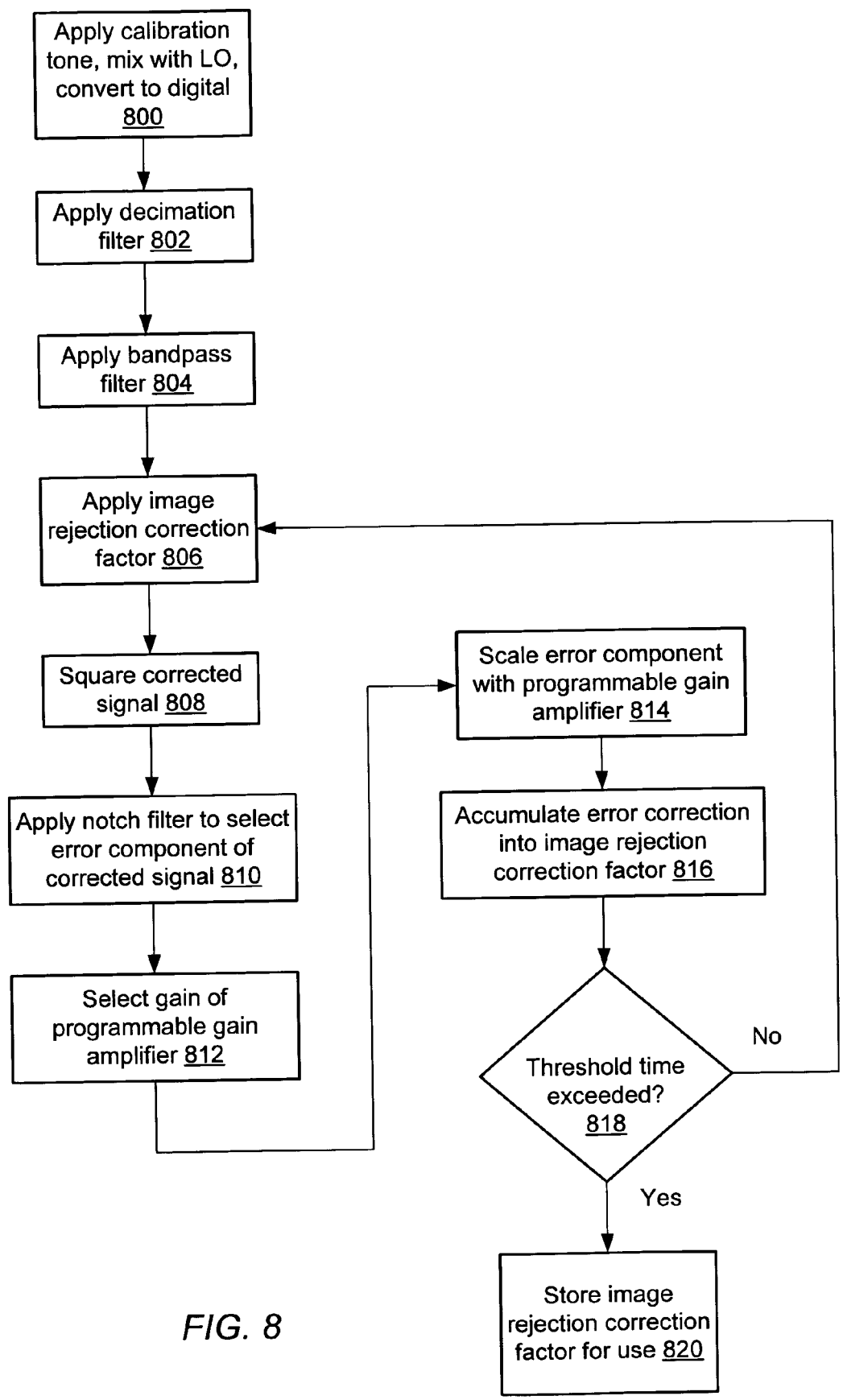
FIG. 8 is a flow diagram illustrating the operation of one embodiment of a system configured to perform image correction factor acquisition using a calibration tone.
Figure 9:
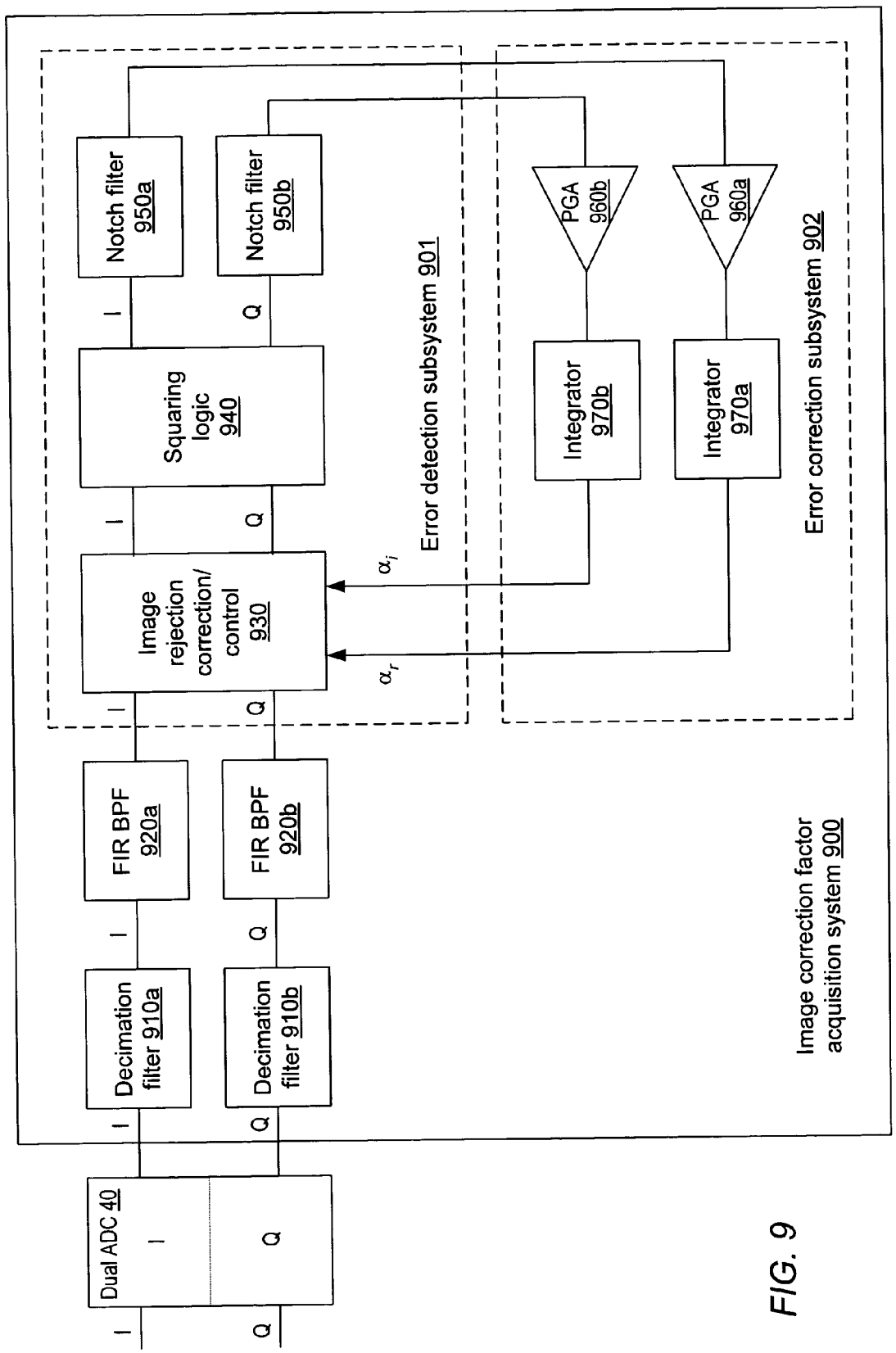
FIG. 9 is a block diagram illustrating one embodiment of a digital system configured to perform acquisition of an image correction factor.

FIG. 9 is a block diagram illustrating one embodiment of a digital system configured to perform acquisition of an image correction factor. In the illustrated embodiment, image correction factor acquisition system 900 (which may also be referred to herein as system 900) is coupled to receive I and Q components of a digital signal from ADC 40 of receiver 15 of FIG. 1. In one embodiment, system 900 may be configured to perform the operations illustrated in the flow chart of FIG. 8. Specifically, system 900 may be configured to operate within a receiver system configured to provide a calibration tone, such as receiver system 15 of FIG. 1. Further, system 900 may be configured to receive a digital representation of a calibration tone mixed with an LO signal and to acquire an image correction factor using the received calibration-tone-based signal.

System 900 includes respective decimation filters 910a and 910b coupled to the I and Q components of the received signal, as well as respective finite impulse response bandpass filters (FIR BPFs) 920a and 920b coupled to the I and Q outputs of decimation filters 910a and 910b. System 900 further includes an error detection subsystem 901 coupled to receive the I and Q outputs of FIR BPFs 920a and 920b and further coupled to receive real and imaginary components $\alpha_r$ and $\alpha_i$ of a complex image correction factor from an error correction subsystem 902. Error correction subsystem 902 is coupled to receive processed I and Q signal components from error detection subsystem 901.

Error detection subsystem 901 includes image rejection (IR) correction/control logic 930 coupled to receive I and Q components from respective FIR BPFs 920a and 920b as well as the aforementioned complex image correction factor. The I and Q outputs of IR correction/control logic 930 are coupled to squaring logic 940, the outputs of which are coupled to respective notch filters 950a and 950b. It is contemplated that in an alternative embodiment, FIR BPFs 920a and 920b may be coupled between IR correction/control logic 930 and squaring logic 940.

Error correction subsystem 902 includes respective programmable gain amplifiers (PGAs) 960a and 960b coupled to the I and Q outputs of error detection subsystem 901. The outputs of PGAs 960a and 960b are coupled to respective integrator/accumulators 970a and 970b, the outputs of which comprise the real and imaginary components of the complex image correction factor as corrected by subsystem 902.

As noted above in the description of digital receiver system 500, a digital signal such as the calibration-tone-based signal received from ADC 40 may be oversampled with respect to its information content. Decimation filters 910a and 910b may be configured to reduce the sample rate of the received digital signal in a manner similar to that performed by decimation filters 530a and 530b of FIG. 5. It is noted that while in some embodiments, decimation filters 910 may be configured identically to decimation filters 530 of FIG. 5, in other embodiments, specific parameters of the two sets of decimation filters may differ. For example, characteristics of the anti-aliasing low pass filter and the sample rate conversion factor may differ in each system.

FIR BPFs 920a and 920b may be configured to reduce harmonic distortion and DC offsets of the IF introduced during the calibration tone generation and mixing process. In one embodiment, FIR BPFs 920 may be configured to pass frequencies in the range $\pm f_{input} - cf_{IF} \leq \pm f_{input} \leq \pm f_{input} + cf_{IF}$ (where 0<c<1), while rejecting frequencies outside this range such as harmonic frequencies of the form $\pm k_{IF}$ (where k is an integer). It is contemplated that in other embodiments, different bandpass filter architectures may be used, such as infinite impulse response (IIR) filters, for example.

IR correction/control logic 930 may be configured to combine the I and Q components of the received digital signal with the received complex image correction factor. In one embodiment, this combination may be configured to be performed by a butterfly operation such as illustrated in FIG. 3B. During an initial iteration, IR correction/control logic 930 may be configured to obtain an initial correction factor estimate, for example by querying a lookup table or reading a hard-coded value. IR correction/control logic 930 may further be configured to perform control features governing execution of the image correction factor acquisition process. For example, in one embodiment, IR correction/control logic 930 may be configured to track elapsed execution time and determine whether iteration should continue or terminate based on a termination criterion. In such an embodiment, IR correction/control logic 930 may further be configured to select a gain for PGAs 960a and 960b dependent upon the elapsed execution time, which gain may be different for successive iterations. Alternatively, IR correction/control logic 930 may be configured to test for a different termination criterion such as error magnitude, for example, and may select a gain based on such a termination criterion. It is contemplated that in an alternative embodiment, the control functions of IR correction/control logic 930 may be implemented in a different or additional block.

Squaring logic 940 may be configured to mathematically square the calibration-tone-based input signal following application of the estimated image correction factor by IR correction/control logic 930. As described in further detail below in conjunction with the description of FIG. 10B, squaring is a nonlinear operation that may aid in detection of an error component in the corrected signal. Specifically, squaring the corrected signal may result in a frequency component at DC that is proportional to a factor of I–$\alpha$, where I represents the native image rejection factor of the system as described above and $\alpha$ represents the current estimate of the image correction factor. As noted above, the extent to which I–$\alpha$ is nonzero may be indicative of the degree of error in $\alpha$. Therefore, the magnitude of the frequency component at DC following the squaring function (which component may also be referred to herein as an error component) may be indicative of the degree of error in $\alpha$. It is noted that in other embodiments, other nonlinear operations may be used in addition to or in place of squaring logic 940 to aid in error component detection.

The operation of squaring logic 940 may result in frequencies other than the error component at DC. In one embodiment, squaring logic 940 may also produce frequencies at $-2f_{IF}$ and $2f_{IF}$. Notch filters 950a and 950b may be configured to suppress these and other undesired frequencies in the I and Q signal paths, respectively, allowing the DC error component to pass. In one embodiment, notch filters 950 may be implemented as FIR filters, but it is contemplated that in other embodiments, other filter architectures may be employed, such as IIR filters, for example. In an alternative embodiment, a highly selective bandpass filter may be employed in place of notch filters 950 to pass the DC component and reject other frequencies, while in yet another alternative embodiment, notch filters 950 may be omitted.

PGAs 960*a* and 960*b* may be configured to scale the error component in the I and Q components passed by notch filters 950 by the gain selected by IR rejection correction/control logic 930. In one embodiment, system 900 may exhibit the characteristic that increased gain in PGAs 960 results in faster convergence of the complex image correction factor estimate but decreased immunity to noise, which may bias the final image correction factor value. Thus, if a high gain is chosen, system 900 may converge more quickly, but the final image correction factor value may not result in sufficient image rejection, whereas is a low gain is chosen, the final image correction factor value may be closer to optimal, but the settling time required to achieve the value may be lengthy. Therefore, in one embodiment of system 900, the gain chosen may be varied as iteration proceeds. For example, early in the iteration process, a large gain may be chosen to make large initial adjustments to the image correction factor estimate, while during later iterations, progressively smaller gains may be chosen to better refine the estimate without the bias potential of the larger gains.

Integrator/accumulators 970*a* and 970*b* may be configured to integrate the error component in the I and Q components, as scaled by PGAs 960, into the current estimate of the image correction factor. In one embodiment, integrator/accumulators 970 may be configured to accumulate the scaled error component into the appropriate real or imaginary component of the image correction factor estimate. In such an embodiment, a negative or positive scaled error may indicate that the current correction factor estimate is too large or small, respectively (as reflected by I–α); thus, directly accumulating the error may have a correcting effect. In other embodiments, different functions may be used to derive a correction from the error component. For example, as described in greater detail below in conjunction with the description of FIG. 11, the error correction value may be a quantized value chosen from a table rather than the full-resolution value indicated by the error component.

It is noted that other embodiments are contemplated in which error detection subsystem 901 may include differing types and numbers of functional blocks configured to detect an error in a current value of a complex image correction factor. Likewise, other embodiments are contemplated in which error correction subsystem 902 may include differing types and numbers of functional blocks configured to modify the complex image correction factor dependent upon a detected error.

It is further noted that in one embodiment, system 900 may be implemented wholly within calibration and correction subsystem 55 of receiver 15 of FIG. 1, for example as a set of software routines stored in memory 51 and executed by DSP 50. In other embodiments, it is contemplated that the elements of system 900 may be implemented in different types of circuits, such as general purpose microprocessors or discrete logic circuits, for example.

Additionally, alternative embodiments are contemplated in which estimation of the complex image correction factor is performed directly rather than iteratively. For example, in one embodiment a maximum likelihood estimator circuit may be used to estimate the values of the calibration-tone-based signal Z and its attenuated image IZ* (where Z and IZ* are analogous to S and IA* illustrated in FIG. 2). The division IZ*/Z* may then be performed to obtain an estimate of native image rejection factor I, which may then be used to estimate the complex image correction factor.

Figure 10A:
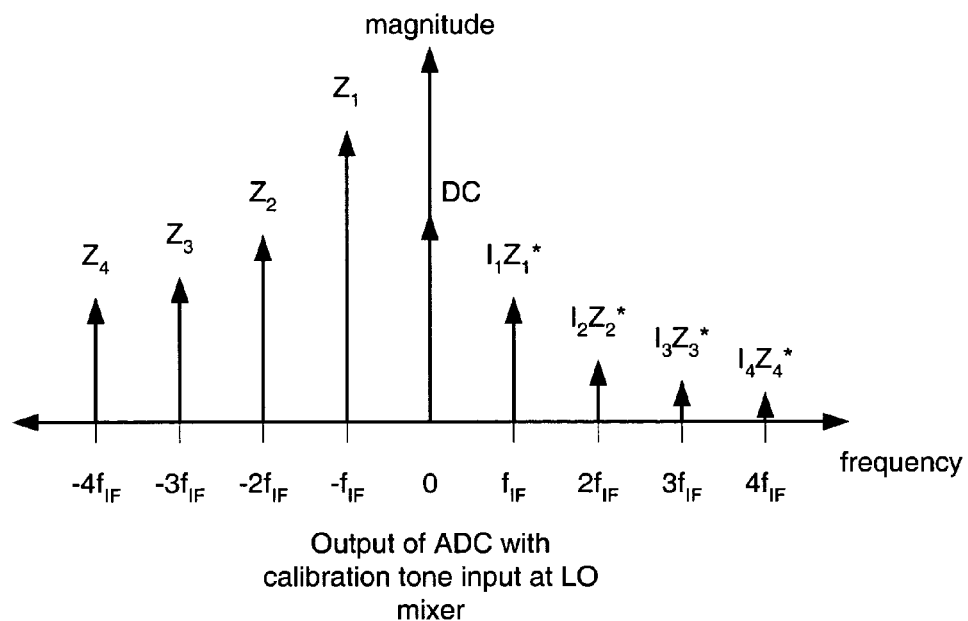
FIG. 10A graphically illustrates the operation of one portion of one embodiment of an image correction factor acquisition system.
Figure 10A:
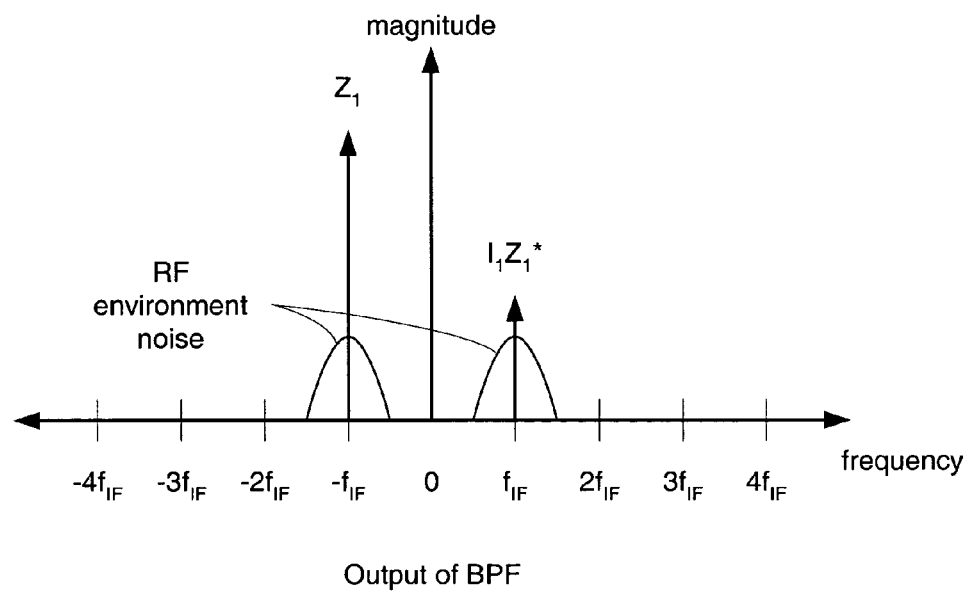

FIG. 10A graphically illustrates the operation of one portion of one embodiment of an image correction factor acquisition system. Referring collectively to FIG. 9 and FIG. 10A, the upper frequency plot of FIG. 10A shows an exemplary frequency distribution of the output of ADC 40 of FIG. 9 while a calibration tone is applied to IQ mixer 25 of FIG. 1. In the illustrated embodiment, the calibration frequency is defined as $f_c = f_{LO} - f_{IF}$. Thus, after mixing with the RX LO signal, a tone of magnitude $Z_1$ is illustrated at frequency $-f_{IF}$, while the attenuated image signal $IZ_1^*$ is illustrated at frequency $f_{IF}$. Additionally, harmonic distortion of the calibration tone may be present and is illustrated as additional signal components at negative multiples of the IF as well as attenuated image signals at positive multiples of the IF. A DC component is also shown. It is noted that the signal components shown are illustrative of an example frequency distribution and that numerous alternative distributions and scenarios are possible and contemplated.

As described above, FIR BPFs 920 may be configured to allow only signal components near IF to pass. The lower frequency plot of FIG. 10A shows an exemplary frequency distribution of the output of FIR BPFs 920 upon receiving the distribution in the upper plot as an input signal. In the illustrated embodiment, FIR BPFs 920 are configured to remove the IF harmonics and the DC component, leaving only the calibration tone and its image at $-f_{IF}$ and $f_{IF}$, respectively. In a real system, isolation of the output of LNA 20 from IQ mixer 25 of FIG. 1 may be imperfect. RF energy may leak into the signal path, for example due to capacitive coupling across switch 68. Some of this energy may propagate through system 900 and is illustrated at the output of FIR BPFs 920 as RF environment noise.

Figure 10B:
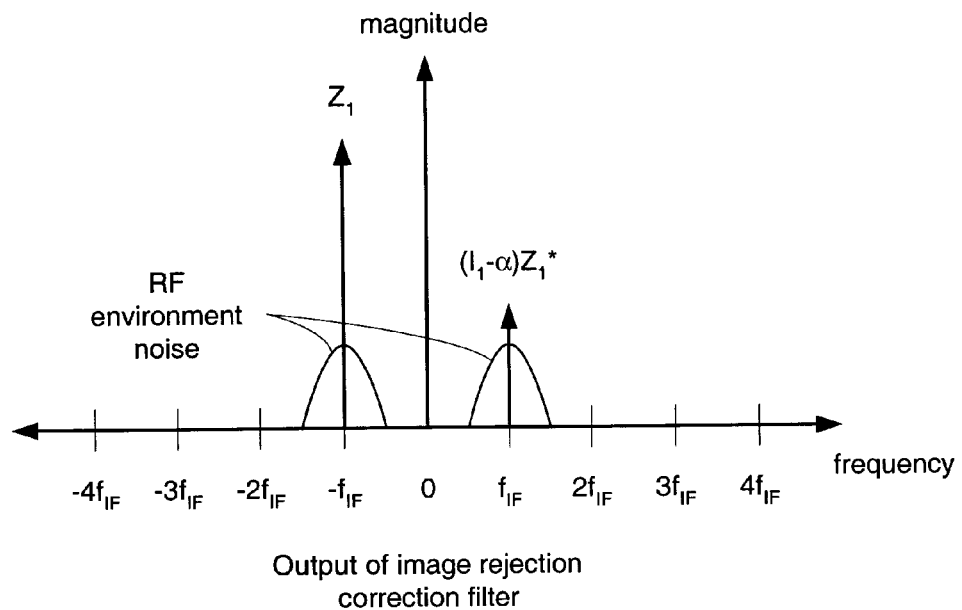
FIG. 10B graphically illustrates the operation of a second portion of one embodiment of an image correction factor acquisition system.
Figure 10B:
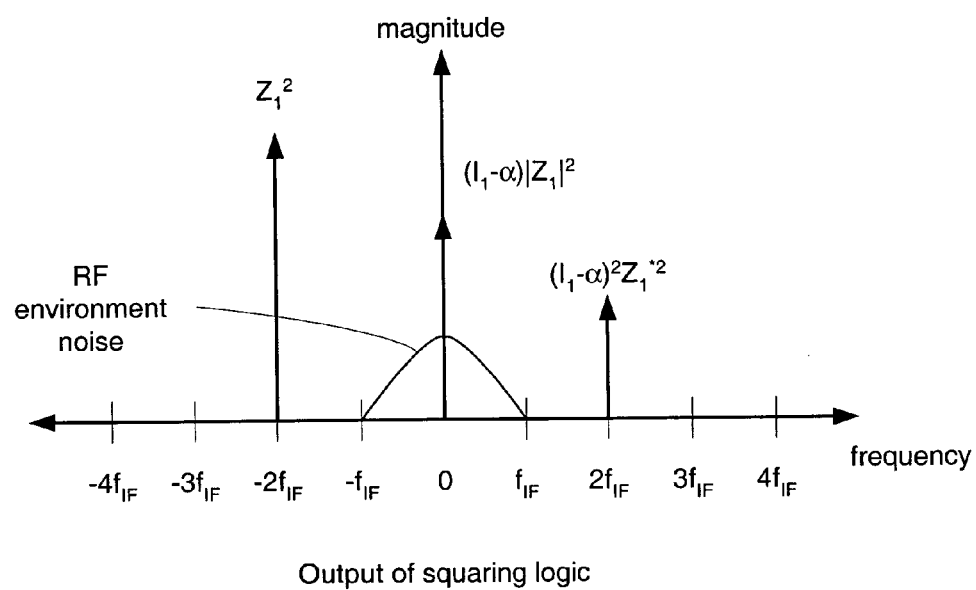

FIG. 10B graphically illustrates the operation of a second portion of one embodiment of an image correction factor acquisition system. Referring collectively to FIG. 9 and FIG. 10B, the upper frequency plot of FIG. 10B shows an exemplary frequency distribution of the output of IR correction/control logic 930 upon receiving the distribution of the lower plot of FIG. 10A as an input signal. Upon applying an estimate of the complex image correction factor, the image of the calibration tone is attenuated by a factor of $I_1 - \alpha$, which may be nonzero as shown.

The lower frequency plot of FIG. 10B shows an exemplary frequency distribution of the output of squaring logic 940 upon receiving the distribution in the upper plot as an input signal. Generally speaking, squaring a complex signal results in components at frequencies twice that of the original signal frequencies and components at the sums of the original signal frequencies. In the illustrated embodiment, the resulting components are $Z_1^2$ at $-2f_{IF}$, $(I_1-\alpha)^2 Z_1^{*2}$ at $2f_{IF}$, and $(I_1-\alpha)|Z_1^*|^2$ at DC. It is noted that the DC term directly indicates the magnitude and sign of the error in the estimate of the complex image correction factor. Further, the DC term requires no further demodulation to extract the error component. It may be seen that by tuning notch filters 950 to remove the double frequency components, the error component may be selected. Following selection, the error component may be scaled and integrated into the current complex image correction factor estimate as described above.

Tracking the Image Correction Factor

As illustrated by the embodiments of FIGS. 8 and 9 described above, a complex image correction factor may be acquired by using a calibration tone and iteratively reducing the error in the complex image correction factor. Additionally, in other embodiments, a complex image correction factor may be estimated without iteration, such as by using a predetermined image corrector value or a maximum likelihood estimator circuit and a divider, as described above.

Irrespective of the approach chosen to acquire a complex image correction factor, however, in some embodiments the characteristics of the system for which the image correction factor was acquired may change. For example, electrical characteristics of a receiver system, such as capacitance and resistance, may vary as the temperature of the receiver environment changes. Such variances may alter the gain and phase shift imbalances of the system, leading to changes in the native image rejection factor I and increasing the error I–α in the image correction factor. Increased error in the image correction factor may increase image interference with a desired signal, reducing system performance.

In one embodiment, the image correction factor acquisition process may be repeated, for example after a certain amount of time in normal operation mode has elapsed, or when a certain degree of image correction factor error or reduced system performance is detected. Alternatively, if changes in the image correction factor due to native image rejection factor variance are small, in one embodiment a receiver system may be configured to dynamically refine the complex image correction factor without performing a full calibration-based acquisition operation. Such a refining process may also be referred to herein as image correction factor tracking.

Figure 11:
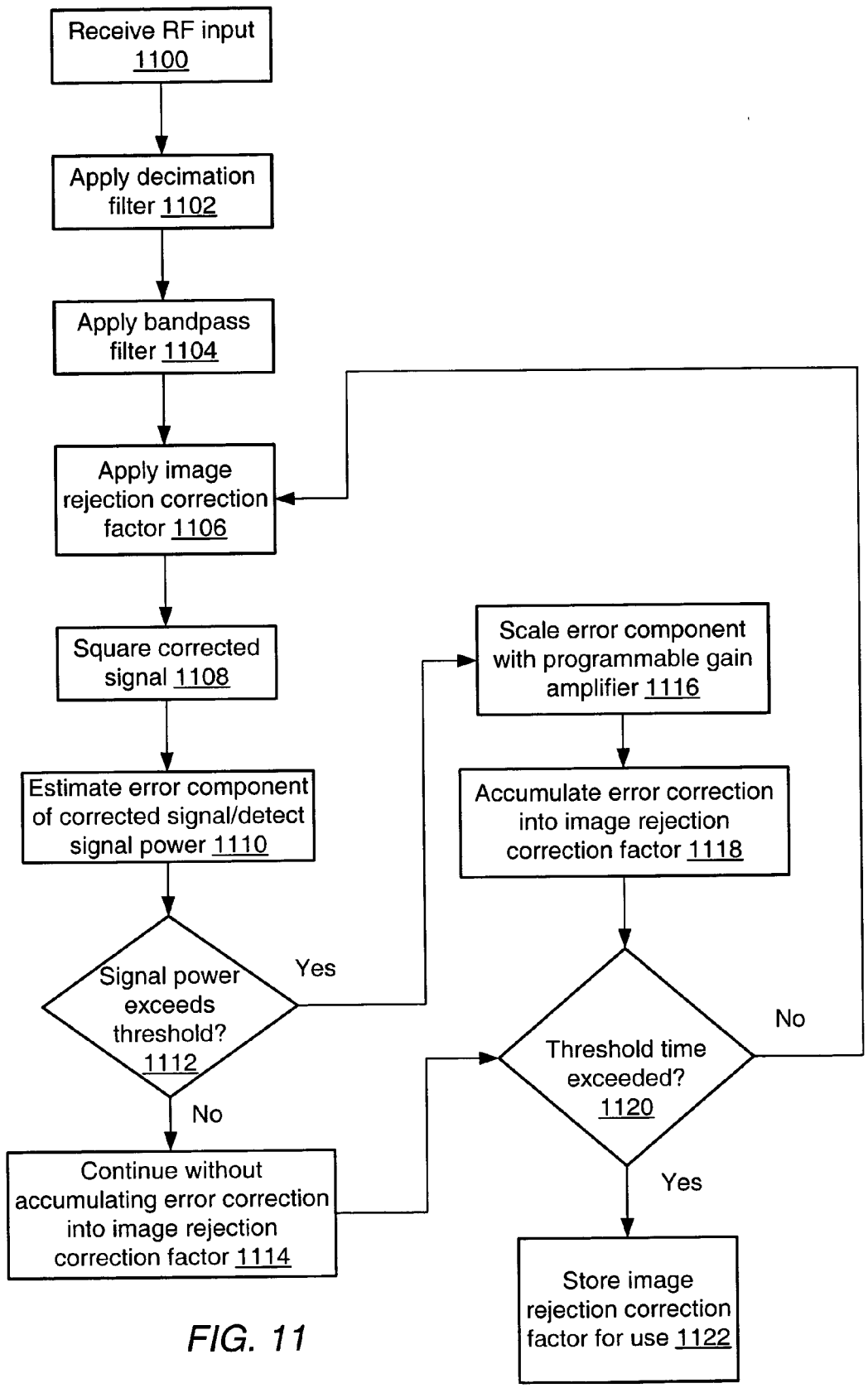
FIG. 11 is a flow diagram illustrating the operation of one embodiment of a system configured to perform image correction factor tracking using an RF input signal.

In one embodiment, the input signal used during image correction factor tracking may be a received RF signal, and the tracking may be performed iteratively. FIG. 11 is a flow diagram illustrating the operation of one embodiment of a system configured to perform image correction factor tracking using an RF input signal. Referring collectively to FIG. 1 and FIG. 8, operation begins in block 1100 where an RF input signal is applied to the system. In the embodiment of receiver system 15 illustrated in FIG. 1, the RF signal may be received from the RF interface via LNA 20 and may be applied to the input of IQ mixer 25 via switch 68 during a normal mode of operation. Additionally, during block 1100 the RF signal input may be mixed with the RX LO signal in IQ mixer 25, which may output the received RF signal mixed with the RX LO signal as a signal comprising separate I and Q components. These components may be amplified by PGAs 30 and 35 respectively, and converted from analog to digital via ADC 40.

As noted above in the description of digital receiver system 500, a digital signal may be oversampled with respect to the information it contains. After the RF input signal has been applied to the image correction factor tracking system and converted to a digital signal, a decimation filter may be applied to reduce the sample rate of the digital signal (block 1102).

The RF input signal may reflect whatever signal energy is received by the receiver RF interface at a given time, and thus may contain a broader spectrum of signal energy than a tonal input. Consequently, the result of mixing the RF input signal with the RX LO signal to yield a channel centered around an IF frequency may include undesired frequencies outside the channel bandwidth. Additionally, harmonic distortion of desired frequencies may be present. To reduce the impact of out-of-band signals, harmonic distortion and DC offset on the image correction factor tracking process, a bandpass filter may be applied to the decimated input signal (block 1104).

Following bandpass filtering, the current complex image correction factor may be applied to the RF-based input signal, and the result may be referred to herein as the corrected signal (block 1106). In one embodiment, the image correction factor estimate may be applied using a butterfly operation such as described above in conjunction with the description of FIG. 3B. It is noted that in an alternative embodiment, the bandpass filtering described above in block 1104 may occur subsequent to application of the image correction factor estimate.

Following application of the image correction factor estimate (or, in an alternative embodiment, following bandpass filtering if it occurs subsequent to application of the image correction factor estimate), the corrected signal may be mathematically squared (block 1108). As described in further detail above in conjunction with the description of FIG. 10B, squaring is a nonlinear operation that may aid in detection of an error component in the corrected signal. It is noted that in other embodiments, other nonlinear operations may be used to aid in error component detection.

An estimator may be applied to the squared signal to detect an error component in the corrected signal, and the power of the corrected signal may be detected (block 1110). The broad spectral nature of the corrected signal (owing to its RF source which may not be tonal) may make it more difficult to use conventional filtering techniques to select the error component from the squared corrected signal. Consequently, in one embodiment an estimator based on the sign rather than the magnitude of the squared corrected signal may be used to estimate the error component. Further, in one embodiment the estimator may be configured to normalize the detected error component value to a lower-resolution value (i.e., a value including fewer significant bits), such as by choosing an error value from a table dependent on the detected error component value or by truncating or shifting the detected error component value, for example.

In one embodiment, the complex image correction factor may only be corrected if the power level detected in the corrected signal exceeds a threshold, which may indicate the presence of a signal rather than noise in the received RF input (block 1112). If the corrected signal power does not exceed a threshold, iteration may continue without accumulating an error correction value into the image correction factor, such as by forcing the error correction value to zero (block 1114). It is contemplated that in other embodiments, correction of the complex image correction factor may occur without detecting corrected signal power or determining whether corrected signal power exceeds a threshold.

Following estimation of the error value indicated by the error component of the squared corrected signal, the error value may be scaled by the PGA to determine an error correction amount, which may be a complex value (block 1116). In one embodiment, the PGA gain applied at this step may be a predetermined value, although in other embodiments, the PGA gain value may vary as described in greater detail below. Following scaling by the PGA, the error correction amount may be accumulated into the estimate of the complex image correction factor (block 1118). As noted above, the error value, and thus the error correction amount, may be of a lower resolution than the estimated error component of the corrected signal.

In order to determine when to terminate the iteration of image correction factor tracking, a termination condition may be detected. In one embodiment, iteration may continue for a fixed period of time and then terminate. In such an embodiment, the iteration time may be compared against a threshold time to determine whether the threshold time has been exceeded (block 1120). If the threshold time has been exceeded, the current estimate of the image correction factor may be stored for use during normal system operation (block 1122). If the threshold time has not been exceeded, operation may proceed from block 1106, where the corrected estimate of the image correction factor is again applied to the RF-based input signal.

It is noted that in other embodiments, termination conditions other than time-based conditions are contemplated. For example, iteration may continue until the estimated error component achieves a particular threshold value. Further, it is noted that in other embodiments the termination condition may be tested at any point during the operation of an iteration. For example, the threshold value (whether elapsed time, error magnitude, or some other value) may be tested prior to image correction factor application or error component estimation. Additionally, it is contemplated that in some embodiments, image correction factor tracking may be performed between desired RF signal bursts, while in other embodiments image correction factor tracking may be performed during RF signal bursts.

It is contemplated that in some embodiments, an image correction factor may be acquired using an RF signal rather than a calibration tone. In such embodiments, the method illustrated in FIG. 11 may be used for image correction factor acquisition in addition to image correction factor tracking. In some such embodiments, when the method of FIG. 11 is used for image correction factor acquisition, the PGA gain applied at step 1116 may be selected from a table or similar data structure indexed by the current elapsed time of the image correction factor acquisition process. In some embodiments, the gain selected may have different values during successive iterations of the acquisition process. Selection of different gain values may enable the trajectory of the acquisition process to be optimized in a manner similar to that described in detail above in conjunction with the description of FIG. 9. It is noted that in other embodiments, gain selection may occur at other points during an iteration of the acquisition process.

Figure 12:
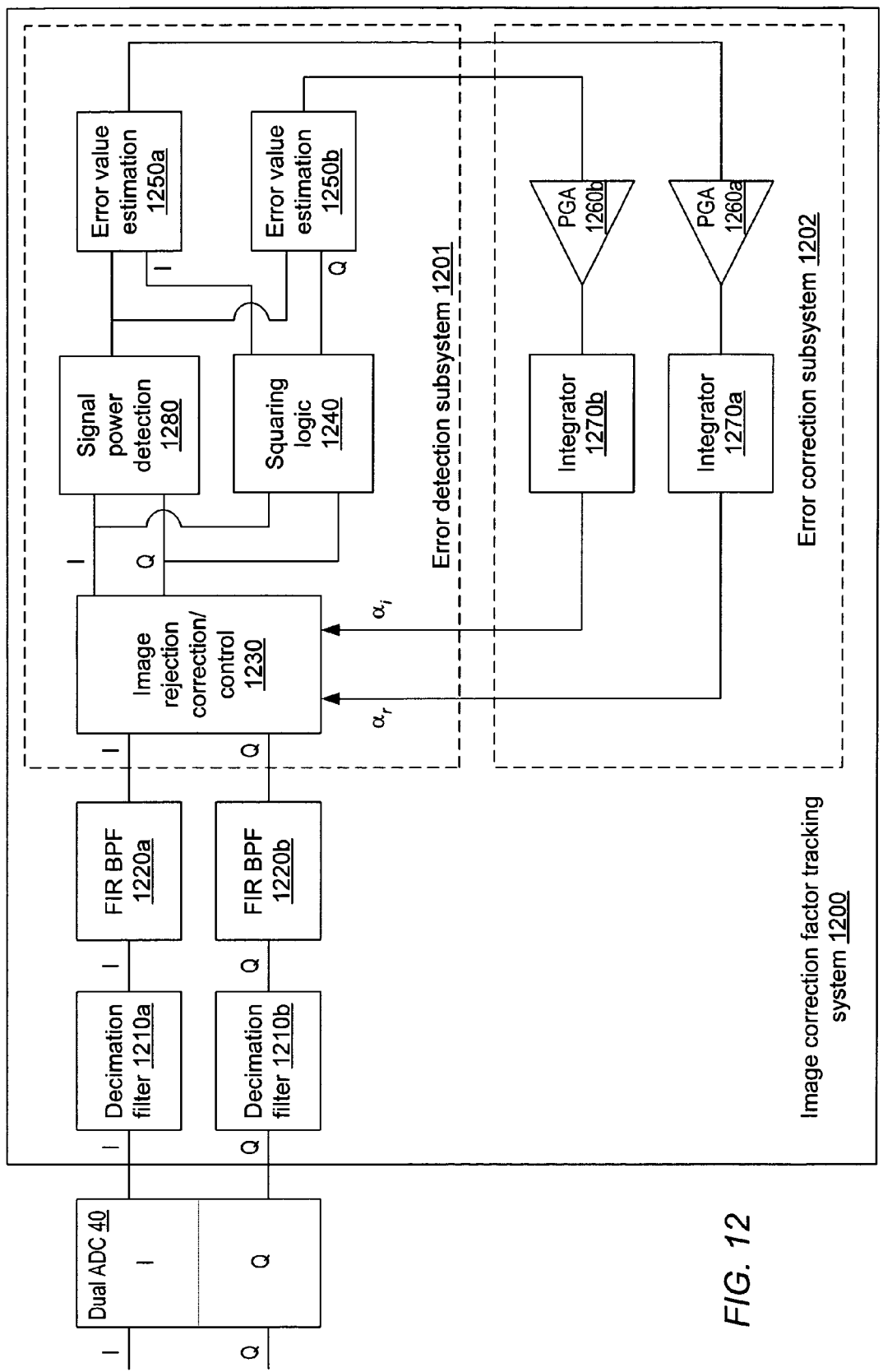
FIG. 12 is a block diagram illustrating one embodiment of a digital system configured to perform tracking of an image correction factor.

FIG. 12 is a block diagram illustrating one embodiment of a digital system configured to perform tracking of an image correction factor. In the illustrated embodiment, image correction factor tracking system 1200 (which may also be referred to herein as system 1200) is coupled to receive I and Q components of a digital signal from ADC 40 of receiver 15 of FIG. 1. In one embodiment, system 1200 may be configured to perform the operations illustrated in the flow chart of FIG. 11. Specifically, system 1200 may be configured to receive a digital representation of an RF input signal mixed with an LO signal and to track an image correction factor using the received RF input-based signal.

System 1200 includes respective decimation filters 1210a and 1210b coupled to the I and Q components of the received signal, as well as respective finite impulse response bandpass filters (FIR BPFs) 1220a and 1220b coupled to the I and Q outputs of decimation filters 1210a and 1210b. System 1200 further includes an error detection subsystem 1201 coupled to receive the I and Q outputs of FIR BPFs 1220a and 1220b and further coupled to receive real and imaginary components $\alpha_r$ and $\alpha_i$ of a complex image correction factor from an error correction subsystem 1202. Error correction subsystem 1202 is coupled to receive processed I and Q signal components from error detection subsystem 1201.

Error detection subsystem 1201 includes image rejection (IR) correction/control logic 1230 coupled to receive I and Q components from respective FIR BPFs 1220a and 1220b as well as the aforementioned complex image correction factor. The I and Q outputs of IR correction/control logic 1230 are coupled to squaring logic 1240, the outputs of which are coupled to respective error value estimation blocks 1250a and 1250b. The I and Q outputs of IR correction/control logic 1230 are also coupled to signal power detection logic 1280, the output of which is coupled to error value estimation blocks 1250a and 1250b. It is contemplated that in an alternative embodiment, FIR BPFs 1220a and 1220b may be coupled between IR correction/control logic 1230 and squaring logic 1240/signal power detection logic 1280.

Error correction subsystem 1202 includes respective programmable gain amplifiers (PGAs) 1260a and 1260b coupled to the I and Q outputs of error detection subsystem 1201. The outputs of PGAs 1260a and 1260b are coupled to respective integrator/accumulators 1270a and 1270b, the outputs of which comprise the real and imaginary components of the complex image correction factor as corrected by subsystem 1202.

As noted above in the description of digital receiver system 500, a digital signal such as the RF-based signal received from ADC 40 may be oversampled with respect to its information content. Decimation filters 1210a and 1210b may be configured to reduce the sample rate of the received digital signal in a manner similar to that performed by decimation filters 530a and 530b of FIG. 5. It is noted that while in some embodiments, decimation filters 1210 may be configured identically to decimation filters 530 of FIG. 5, in other embodiments, specific parameters of the two sets of decimation filters may differ. For example, characteristics of the anti-aliasing low pass filter and the sample rate conversion factor may differ in each system.

FIR BPFs 1220a and 1220b may be configured to reduce out-of-band signals included in the RF-based input signal as well as harmonic distortion introduced during the mixing and filtering process. It is contemplated that in other embodiments, different bandpass filter architectures may be used, such as infinite impulse response (IIR) filters, for example. It is further contemplated that in some embodiments, high-pass filters may be used instead of BPFs 1220.

IR correction/control logic 1230 may be configured to combine the I and Q components of the received digital signal with the received complex image correction factor. In one embodiment, this combination may be configured to be performed by a butterfly operation such as illustrated in FIG. 3B. IR correction/control logic 1230 may further be configured to perform control features governing execution of the image correction factor tracking process. For example, in one embodiment, IR correction/control logic 1230 may be configured to track elapsed execution time and determine whether iteration should continue or terminate based on a termination criterion. It is contemplated that in an alternative embodiment, the control functions of IR correction/control logic 1230 may be implemented in a different or additional block.

Squaring logic 1240 may be configured to mathematically square the RF-based input signal following application of the estimated image correction factor by IR correction/control logic 1230. As described in further detail above in conjunction with the description of FIG. 10B, squaring is a nonlinear operation that may aid in detection of an error component in the corrected signal. Specifically, squaring the corrected signal may result in a frequency component at DC that is attenuated by a factor of I–α, where I represents the native image rejection factor of the system as described above and a represents the current estimate of the image correction factor. As noted above, the extent to which I–α is nonzero may be indicative of the degree of error in α. Therefore, the magnitude of the frequency component at DC following the squaring function (which component may also be referred to herein as an error component) may be indicative of the degree of error in α. It is noted that in other embodiments, other nonlinear operations may be used in addition to or in place of squaring logic 1240 to aid in error component detection.

Signal power detection logic 1280 may be configured to detect the power level of the corrected signal and to compare the detected power level to a threshold, producing an output indicative of whether a signal is present or absent according to the comparison. In one embodiment, signal power detection logic 1280 may be configured to detect the total power of the corrected signal, while in another embodiment signal power detection logic 1280 may be configured to detect the power at a representative set of frequencies of the corrected signal. Other embodiments of this logic are possible and contemplated. Further, in some embodiments of system 1200, signal power detection logic 1280 may be omitted.

The operation of squaring logic 1240 coupled with the broad spectral content of the received RF signal may result in frequencies other than the error component at DC. Error value estimation logic 1250a and 1250b may be configured to estimate the value of the error component in each of the I and Q components, respectively. In one embodiment, error value estimation logic 1250 may be configured to estimate the error component based on the sign rather than the magnitude of the squared corrected signal. Further, in one embodiment error value estimation logic 1250 may be configured to normalize the estimated error component value to a lower-resolution value (i.e., a value including fewer significant bits), such as by choosing an error value from a table dependent on the detected error component value or by truncating or shifting the detected error component value, for example.

In the illustrated embodiment, error value estimation logic 1250 is coupled to receive an indication of whether a signal is present or absent from signal power detection logic 1280. If an indication of signal absence is received, error value estimation logic 1250 may be configured to terminate iteration of system 1200, or alternatively may force the error value to zero. In an embodiment of system 1200 where signal power detection logic 1280 is omitted, error value estimation logic 1250 may be configured to unconditionally estimate the value of the error component of the squared corrected signal.

PGAs 1260a and 1260b may be configured to scale the estimated value of the error in the I and Q components by a gain that, in one embodiment, may be a predetermined value.

Integrator/accumulators 1270a and 1270b may be configured to integrate the error value in the I and Q components, as scaled by PGAs 1260, into the current estimate of the image correction factor. In one embodiment, integrator/accumulators 1270 may be configured to add the scaled error value into the appropriate real or imaginary component of the image correction factor estimate. In such an embodiment, a negative or positive scaled error may indicate that the current correction factor estimate is too large or small, respectively (as reflected by I–α); thus, directly accumulating the error may have a correcting effect. In other embodiments, different functions may be used to derive a correction from the error value.

It is noted that other embodiments are contemplated in which error detection subsystem 1201 may include differing types and numbers of functional blocks configured to detect an error in a current value of a complex image correction factor. Likewise, other embodiments are contemplated in which error correction subsystem 1202 may include differing types and numbers of functional blocks configured to apply a correction to a complex image correction factor dependent upon a detected error.

It is further noted that in one embodiment, system 1200 may be implemented wholly within calibration and correction subsystem 55 of receiver 15 of FIG. 1, for example as a set of software routines stored in memory 51 and executed by DSP 50. In other embodiments, it is contemplated that the elements of system 1200 may be implemented in different types of circuits, such as general purpose microprocessors or discrete logic circuits, for example.

It is contemplated that in one embodiment, the method and system for image correction factor acquisition, illustrated in the embodiments of FIGS. 8 and 9, may be combined with the method and system for image correction factor tracking, illustrated in the embodiments of FIGS. 11 and 12. For example, a receiver system such as receiver system 15 of FIG. 1 may be configured to initially acquire an image correction factor using image correction factor acquisition system 900 of FIG. 9 during a calibration mode of operation. Such a receiver system may then periodically or aperiodically update the acquired image correction factor using image correction factor tracking system 1200 of FIG. 12. Alternatively, a receiver system may implement either the image correction factor acquisition system or the image correction factor tracking system.

The aforementioned methods and systems for using, acquiring, and tracking an image correction factor, as illustrated in FIGS. 3–12, may operate within receiver system 15 of FIG. 1, as described above. In the illustrated embodiment, receiver system 15 is a heterodyne system using a single IF frequency. However, it is contemplated that the methods and systems illustrated in FIGS. 3–12 may operate within other embodiments of receiver system 15 that exhibit image frequencies. Specifically, in other embodiments receiver system 15 may include different receiver architectures, such as a multiple-conversion architecture using multiple IF frequencies, for example.

Additionally, in some embodiments the methods and systems illustrated in FIGS. 3–12 may be implemented as program instructions and/or data accessible by a computation device, as described above. In the embodiment of receiver system 15 of FIG. 1, such instructions and data may be stored as code 52 within memory 51 and may be accessed by DSP 50 for execution. However, in other embodiments, the program instructions and/or data included in code 52 may be received, sent or stored upon different types of computer-accessible media. Generally speaking, a computer-accessible medium may include storage media or memory media such as magnetic or optical media, e.g., disk or CD-ROM included. A computer-accessible medium may also include volatile or non-volatile media such as RAM (e.g. SDRAM, DDR SDRAM, RDRAM, SRAM, NVRAM, etc.), ROM, etc. Further, a computer-accessible medium may include transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A receiver circuit comprising:
   an IQ signal source configured to provide a digital signal comprising in-phase (I) and quadrature (Q) components; and
   an image correction unit coupled to said IQ signal source and configured to combine said digital signal with a complex image correction factor;
   wherein the image correction unit is configured to combine said digital signal with said complex image correction factor by:
   multiplying said in-phase component by a value of a first function of a real portion of said complex image correction factor to form a first product;
   multiplying said in-phase component by a value of a first function of an imaginary portion of said complex image correction factor to form a second product;
   multiplying said quadrature component by a value of a second function of the real portion of said complex image correction factor to form a third product;
   multiplying said quadrature component by a value of a second function of the imaginary portion of said complex image correction factor to form a fourth product;
   accumulating said first and fourth products; and
   accumulating said second and third products.

2. The receiver circuit as recited in claim 1, wherein said image correction unit is configured to combine said digital signal with said complex image correction factor using a cross-accumulation operation.

3. The receiver circuit as recited in claim 1, wherein:
   said first function of said real portion of said complex image correction factor comprises $1-\alpha_r$;
   said second function of said real portion of said complex image correction factor comprises $1+\alpha_r$; and
   said first and said second function of said imaginary portion of said complex image correction factor each comprise $-\alpha_i$;
   wherein $\alpha_r$ denotes said real portion of said complex image correction factor and $\alpha_i$ denotes said imaginary portion of said complex image correction factor.

4. The receiver circuit as recited in claim 1, wherein:
   said IQ signal source is further configured to provide each of said in-phase and quadrature components of said digital signal as a corresponding serial bit stream comprising a sequence of bits, wherein each bit is indicative of a positive or negative value; and
   said image correction unit is configured to multiply each of said in-phase and quadrature components with a respective portion of said complex image correction factor by complementing the sign of said respective portion of said complex image correction factor responsive to a bit of said corresponding serial bit stream indicating a negative value and retaining the sign of said respective portion of said complex image correction factor without complementing responsive to said bit of said corresponding serial bit stream indicating a positive value.

5. The receiver circuit as recited in claim 4, wherein said IQ signal source further comprises a delta-sigma analog to digital conversion circuit.

6. The receiver circuit as recited in claim 1, wherein combining said digital signal with a complex image correction factor includes mixing said digital signal with a frequency conversion signal.

7. The receiver circuit as recited in claim 6, wherein said image correction unit is configured to combine said digital signal with said complex image correction factor including mixing said digital signal with said frequency conversion signal by:
   multiplying said in-phase component by a value of a first function of said complex image correction factor and said frequency conversion signal to form a first product;
   multiplying said in-phase component by a value of a second function of said complex image correction factor and said frequency conversion signal to form a second product;
   multiplying said quadrature component by a value of a third function of said complex image correction factor and said frequency conversion signal to form a third product;
   multiplying said quadrature component by a value of a fourth function of said complex image correction factor and said frequency conversion signal to form a fourth product;
   accumulating said first and third products; and
   accumulating said second and fourth products.

8. The receiver circuit as recited in claim 7, wherein:
   said first function comprises $(1-\alpha_r)\cos(kn)-\alpha_i \sin(kn)$;
   said second function comprises $-(1-\alpha_r)\sin(kn)-\alpha_i \cos(kn)$;
   said third function comprises $(1+\alpha_r)\sin(kn)-\alpha_i \cos(kn)$; and
   said fourth function comprises $(1+\alpha_r)\cos(kn)+\alpha_i \sin(kn)$;
   wherein $\alpha_r$ denotes a real portion of said complex image correction factor, $\alpha_i$ denotes an imaginary portion of said complex image correction factor, k denotes a constant corresponding to said frequency conversion signal, and n denotes a time in the digital domain.

9. The receiver circuit as recited in claim 7, wherein each of said first, second, third and fourth functions of said complex image correction factor and said frequency conversion signal is a periodic function, and wherein said image correction unit is further configured to store a precomputed portion of a period of each of said first, second, third and fourth functions.

10. A method comprising:
    generating a digital signal comprising in-phase (I) and quadrature (Q) components; and
    combining said digital signal with a complex image correction factor in response to said generating;
    wherein combining said digital signal with said complex image correction factor further comprises:
    multiplying said in-phase component by a value of a first function of the real portion of said complex image correction factor to form a first product;
    multiplying said in-phase component by a value of a first function of the imaginary portion of said complex image correction factor to form a second product;
    multiplying said quadrature component by a value of a second function of the real portion of said complex image correction factor to form a third product;
    multiplying said quadrature component by a value of a second function of the imaginary portion of said complex image correction factor to form a fourth product;
    accumulating said first and fourth products; and
    accumulating said second and third products.

11. The method as recited in claim 10, wherein combining said digital signal with said complex image correction factor comprises performing a cross-accumulation operation.

12. The method as recited in claim 10, wherein:
said first function of said real portion of said complex image correction factor comprises $1-\alpha_r$;
said second function of said real portion of said complex image correction factor comprises $1+\alpha_r$; and
said first and said second function of said imaginary portion of said complex image correction factor each comprise $-\alpha_i$;
wherein $\alpha_r$ denotes said real portion of said complex image correction factor and $\alpha_i$ denotes said imaginary portion of said complex image correction factor.

13. The method as recited in claim 10, wherein:
generating said digital signal further comprises providing each of said in-phase and quadrature components of said digital signal as a corresponding serial bit stream comprising a sequence of bits, wherein each bit is indicative of a positive or negative value; and
combining said digital signal with said complex image correction factor comprises multiplying each of said in-phase and quadrature components with a respective portion of said complex image correction factor by complementing the sign of said respective portion of said complex image correction factor responsive to a bit of said corresponding serial bit stream indicating a negative value and retaining the sign of said respective portion of said complex image correction factor without complementing responsive to said bit of said corresponding serial bit stream indicating a positive value.

14. The method as recited in claim 13, wherein said generating is performed by a delta-sigma analog to digital conversion circuit.

15. The method as recited in claim 10, wherein combining said digital signal with a complex image correction factor includes mixing said digital signal with a frequency conversion signal.

16. The method as recited in claim 15, wherein said combining further comprises:
multiplying said in-phase component by a value of a first function of said complex image correction factor and said frequency conversion signal to form a first product;
multiplying said in-phase component by a value of a second function of said complex image correction factor and said frequency conversion signal to form a second product;
multiplying said quadrature component by a value of a third function of said complex image correction factor and said frequency conversion signal to form a third product;
multiplying said quadrature component by a value of a fourth function of said complex image correction factor and said frequency conversion signal to form a fourth product;
accumulating said first and third products; and
accumulating said second and fourth products.

17. The method as recited in claim 16, wherein:
said first function comprises $(1-\alpha_r)\cos(kn)-\alpha_i \sin(kn)$;
said second function comprises $-(1-\alpha_r)\sin(kn)-\alpha_i \cos(kn)$;
said third function comprises $(1+\alpha_r)\sin(kn)-\alpha_i \cos(kn)$; and
said fourth function comprises $(1+\alpha_r)\cos(kn)+\alpha_i \sin(kn)$;
wherein $\alpha_r$ denotes a real portion of said complex image correction factor, $\alpha_i$ denotes an imaginary portion of said complex image correction factor, k denotes a constant corresponding to said frequency conversion signal, and n denotes a time in the digital domain.

18. The method as recited in claim 16, wherein each of said first, second, third and fourth functions of said complex image correction factor and said frequency conversion signal is a periodic function, and wherein the method further comprises storing a precomputed portion of a period of each of said first, second, third and fourth functions.

19. A receiver circuit comprising:
an IQ mixer configured to provide a signal comprising in-phase (I) and quadrature (Q) components;
an analog-to-digital converter coupled to said IQ mixer and configured to convert said signal to a digital signal; and
an image correction unit coupled to said analog-to-digital converter and configured to combine said digital signal with a complex image correction factor;
wherein the image correction unit is configured to combine said digital signal with said complex image correction factor by:
multiplying said in-phase component by a value of a first function of a real portion of said complex image correction factor to form a first product;
multiplying said in-phase component by a value of a first function of an imaginary portion of said complex image correction factor to form a second product;
multiplying said quadrature component by a value of a second function of the real portion of said complex image correction factor to form a third product;
multiplying said quadrature component by a value of a second function of the imaginary portion of said complex image correction factor to form a fourth product;
accumulating said first and fourth products; and
accumulating said second and third products.

20. A computer-accessible medium comprising program instructions, wherein the program instructions are executable by a processor to:
receive a digital signal comprising in-phase (I) and quadrature (Q) components; and
combine said digital signal with a complex image correction factor;
wherein to combine said digital signal with said complex image correction factor, said instructions are further executable to:
multiply said in-phase component by a value of a first function of a real portion of said complex image correction factor to form a first product;
multiply said in-phase component by a value of a first function of an imaginary portion of said complex image correction factor to form a second product;
multiply said quadrature component by a value of a second function of the real portion of said complex image correction factor to form a third product;
multiply said quadrature component by a value of a second function of the imaginary portion of said complex image correction factor to form a fourth product;
accumulate said first and fourth products; and
accumulate said second and third products.

21. The computer-accessible medium as recited in claim 20, wherein said processor is a digital signal processor (DSP).

* * * * *